(12) United States Patent
Araki et al.

(10) Patent No.: US 9,651,865 B2
(45) Date of Patent: May 16, 2017

(54) NEGATIVE-TYPE PHOTOSENSITIVE COLORING COMPOSITION, CURED FILM, LIGHT-SHIELDING PATTERN FOR TOUCH PANEL, AND TOUCH PANEL MANUFACTURING METHOD

(71) Applicant: TORAY INDUSTRIES, INC., Tokyo (JP)

(72) Inventors: Hitoshi Araki, Otsu (JP); Mitsuhito Suwa, Otsu (JP); Toru Okazawa, Otsu (JP); Yoshihiko Inoue, Otsu (JP); Akihiro Ishikawa, Otsu (JP); Akinori Saeki, Otsu (JP)

(73) Assignee: TORAY INDUSTRIES, INC., Tokyo (JP)

(*) Notice: Subject to any disclaimer, the term of this patent is extended or adjusted under 35 U.S.C. 154(b) by 0 days.

(21) Appl. No.: 14/758,101

(22) PCT Filed: Feb. 7, 2014

(86) PCT No.: PCT/JP2014/052887
§ 371 (c)(1),
(2) Date: Jun. 26, 2015

(87) PCT Pub. No.: WO2014/126013
PCT Pub. Date: Aug. 21, 2014

(65) Prior Publication Data
US 2015/0378258 A1    Dec. 31, 2015

(30) Foreign Application Priority Data

Feb. 14, 2013    (JP) .................................. 2013-026242

(51) Int. Cl.
*G03F 7/075* (2006.01)
*G03F 7/027* (2006.01)
(Continued)

(52) U.S. Cl.
CPC ............ *G03F 7/0757* (2013.01); *G03F 7/027* (2013.01); *G03F 7/029* (2013.01); *G03F 7/038* (2013.01);
(Continued)

(58) Field of Classification Search
CPC .................... G06F 3/041; G06F 3/044; G06F 2203/04103; G06F 2203/04107;
(Continued)

(56) References Cited

U.S. PATENT DOCUMENTS

2014/0186592 A1* 7/2014 Jeon ......................... B32B 5/16
428/195.1

FOREIGN PATENT DOCUMENTS

JP    2008-203605 A    9/2008
JP    2009-19093 A    1/2009
(Continued)

OTHER PUBLICATIONS

English-language translation of JP 2010-039056 (Feb. 2010).*
(Continued)

*Primary Examiner* — John A McPherson
(74) *Attorney, Agent, or Firm* — Birch, Stewart, Kolasch & Birch, LLP

(57) ABSTRACT

The purpose of the present invention is to provide a negative-type photosensitive coloring composition ideal for forming a white, light-blocking pattern and which not only has excellent chemical resistance, but also has extremely excellent heat resistance and does not yellow or crack even when undergoing high-temperature processing. This negative-type photosensitive coloring composition contains (A) a white pigment, (B) a polysiloxane obtained by co-hydrolyzate condensation of an alkoxysilane compound containing a
(Continued)

compound of a specific structure, (C) polyfunctional acrylic monomers, (D) a photoradical polymerization initiator and (E) an organic solvent.

12 Claims, 1 Drawing Sheet

(51) Int. Cl.
*G03F 7/029* (2006.01)
*G03F 7/038* (2006.01)
*G03F 7/105* (2006.01)
*G03F 7/40* (2006.01)
*G03F 7/16* (2006.01)
*G03F 7/20* (2006.01)
*G03F 7/32* (2006.01)
*G06F 3/041* (2006.01)

(52) U.S. Cl.
CPC ............ *G03F 7/0755* (2013.01); *G03F 7/105* (2013.01); *G03F 7/168* (2013.01); *G03F 7/20* (2013.01); *G03F 7/32* (2013.01); *G03F 7/40* (2013.01); *G06F 3/041* (2013.01); *G06F 2203/04103* (2013.01); *G06F 2203/04107* (2013.01)

(58) Field of Classification Search
CPC .......... G03F 7/027; G03F 7/029; G03F 7/038; G03F 7/105; G03F 7/168; G03F 7/20; G03F 7/32; G03F 7/40; G03F 7/032; G03F 7/0757
USPC ............ 430/280.1, 288.1, 321; 345/173, 174
See application file for complete search history.

(56) References Cited

FOREIGN PATENT DOCUMENTS

| | | |
|---|---|---|
| JP | 2010-39056 A | 2/2010 |
| JP | 2012-98344 A | 5/2012 |
| JP | 2012-215837 A | 11/2012 |
| JP | 2012-242928 A | 12/2012 |
| TW | 201042387 A1 | 12/2010 |
| WO | WO 2009/090867 A1 | 7/2009 |
| WO | WO 2011/114995 A1 | 9/2011 |

OTHER PUBLICATIONS

English-language translation of JP 2009-019093 (Jan. 2009).*
English-language translation of KR 2014-0086584 (Jul. 2014).*
International Search Report, issued in PCT/JP2014/052887, dated Mar. 11, 2014.

* cited by examiner

NEGATIVE-TYPE PHOTOSENSITIVE COLORING COMPOSITION, CURED FILM, LIGHT-SHIELDING PATTERN FOR TOUCH PANEL, AND TOUCH PANEL MANUFACTURING METHOD

TECHNICAL FIELD

The present invention relates to a negative-type photosensitive coloring composition, a cured film, a light-shielding pattern for a touch panel, and a method for manufacturing a touch panel.

BACKGROUND ART

In recent years, mobile equipment, such as smartphones and tablet PCs, in which a projection capacitance type touch panel is used, rapidly come into widespread use. In the projection capacitance type touch panel, it is common that a pattern of ITO (indium tin oxide) film is formed in a screen area and a metal wire portion made of molybdenum is formed at the periphery of the screen area. In order to blind the metal wire portion, a black or white light-shielding pattern is often formed on an inner surface of a cover glass of the projection capacitance type touch panel.

A type of the touch panel is broadly divided into an out-cell type in which a touch panel layer is formed between a cover glass and a liquid crystal panel, an on-cell type in which a touch panel layer is formed on a liquid crystal panel, an in-cell type in which a touch panel layer is formed within a liquid crystal panel, and an OGS (one glass solution) type in which a touch panel layer is directly formed on a cover glass, and development of a touch panel of OGS type is increasing since it can be low-profile and its weight can be reduced than conventional one.

On the other hand, a negative-type photosensitive composition containing a silicon oxide compound is known (Patent Documents 1 to 4).

PRIOR ART DOCUMENTS

Patent Documents

Patent Document 1: Japanese Patent Laid-open Publication No. 2010-03905
Patent Document 2: JP Patent No. 5078475
Patent Document 3: JP Patent No. 4110401
Patent Document 4: WO 2010/061744 A

SUMMARY OF THE INVENTION

Problems to be Solved by the Invention

The present inventors thought that a negative-type photosensitive composition containing a silicon oxide compound is suitable for formation of a white light-shielding pattern in the production of a touch panel since the negative-type photosensitive composition is generally excellent in heat resistance. However, there is no specific example in which a white pigment is contained in the conventional negative-type photosensitive composition, and it has been difficult to use the negative-type photosensitive composition containing a white pigment for production of a touch panel of an OGS type requiring high-temperature treatment such as ITO film formation because there is a possibility that yellowing and cracks may occur in the resulting cured film due to high-temperature treatment if the negative-type photosensitive composition contains a white pigment.

Thus, it is an object of the present invention to provide a negative-type photosensitive coloring composition suitable for the formation of a white light-shielding pattern which is not only excellent in chemical resistance but also extremely excellent in heat resistance and does not cause yellowing and cracks even after undergoing high-temperature treatment.

Solutions to the Problems

In order to solve the above-mentioned problem, the present inventors noted a structure of polysiloxane in a negative-type photosensitive composition containing a silicon oxide compound, which contains a white pigment, and made earnest investigations. Then, they found out that the negative-type photosensitive composition exerts an remarkable effect when the composition contains polysiloxane obtained by combining a plurality of alkoxysilane compounds having specific structures and performing co-hydrolyzate condensation thereof. That is, the present invention provides a negative-type photosensitive coloring composition described below, and a cured film formed by curing the negative-type photosensitive coloring composition.

A negative-type photosensitive coloring composition, containing (A) a white pigment; (B) a polysiloxane obtained by co-hydrolyzate condensation of an alkoxysilane compound containing a compound represented by the following general formula (1), a compound represented by the following general formula (2) and a compound represented by the following general formula (3); (C) a polyfunctional acrylic monomer; (D) a photoradical polymerization initiator; and (E) an organic solvent:

[Chemical Formula 1]

$$R^1{}_2Si(OR^2)_2 \quad (1)$$

(wherein $R^1$s each independently represent a methyl group or a phenyl group, and $R^2$s each independently represent hydrogen or an alkyl group having 1 to 4 carbon atoms);

[Chemical Formula 2]

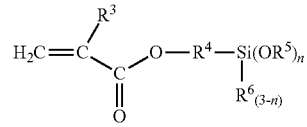

(2)

(wherein $R^3$ represents a methyl group or hydrogen, $R^4$ represents an alkylene group having 1 to 4 carbon atoms, $R^5$s each independently represent hydrogen or an alkyl group having 1 to 4 carbon atoms, $R^6$s each independently represent an alkyl group having 1 to 6 carbon atoms, and n represents an integer of 1 to 3); and

[Chemical Formula 3]

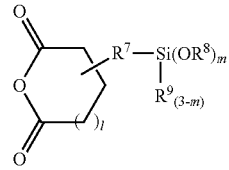

(3)

(wherein l represents an integer of 0 to 2, m represents an integer of 1 to 3, $R^7$ represents an alkylene group having 1 to 4 carbon atoms, $R^8$s each independently represent hydrogen or an alkyl group having 1 to 4 carbon atoms, and $R^9$s each independently represent an alkyl group having 1 to 6 carbon atoms).

Effects of the Invention

According to the negative-type photosensitive coloring composition of the present invention, it becomes possible to form a white cured film which is not only excellent in chemical resistance but also extremely excellent in heat resistance and does not cause yellowing and cracks even after undergoing high-temperature treatment.

EMBODIMENTS OF THE INVENTION

Figure 1:
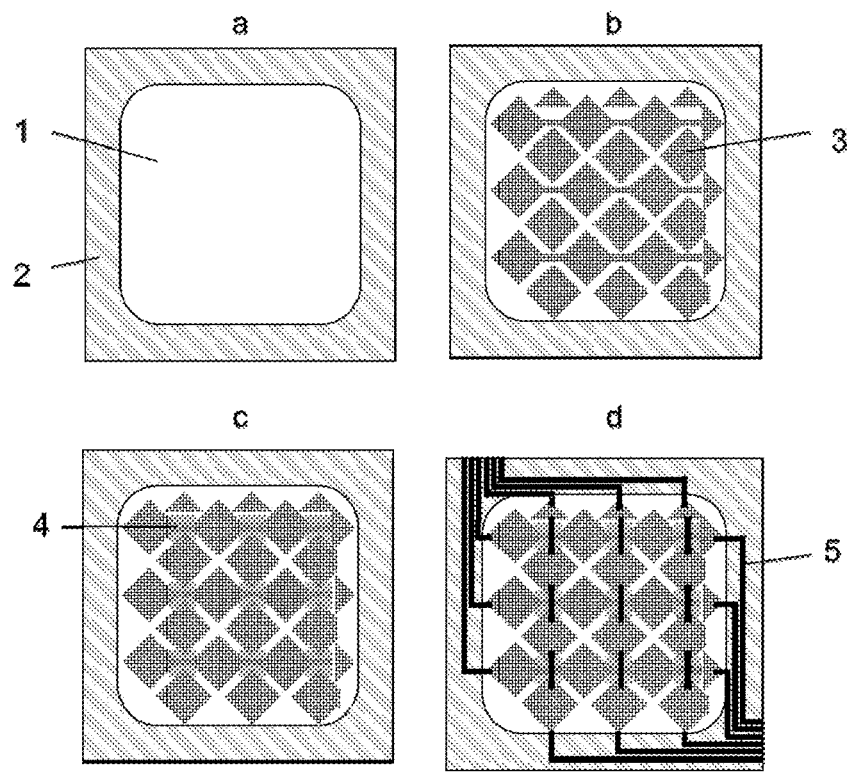
FIG. 1 is a schematic view showing a process of preparation of a light-shielding cured film, a patterned ITO, a transparent insulating film and a MAM wire.

The negative-type photosensitive coloring composition of the present invention is characterized by containing (A) a white pigment; (B) a polysiloxane obtained by co-hydrolyzate condensation of an alkoxysilane compound containing a compound represented by the following general formula (1), a compound represented by the following general formula (2) and a compound represented by the following general formula (3); (C) a polyfunctional acrylic monomer; (D) a photoradical polymerization initiator; and (E) an organic solvent:

[Chemical Formula 4]

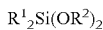

(1)

(wherein $R^1$s each independently represent a methyl group or a phenyl group, and $R^2$s each independently represent hydrogen or an alkyl group having 1 to 4 carbon atoms);

[Chemical Formula 5]

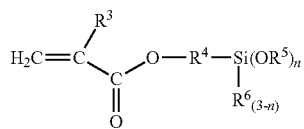

(2)

(wherein $R^3$ represents a methyl group or hydrogen, $R^4$ represents an alkylene group having 1 to 4 carbon atoms, $R^5$s each independently represent hydrogen or an alkyl group having 1 to 4 carbon atoms, $R^6$s each independently represent an alkyl group having 1 to 6 carbon atoms, and n represents an integer of 1 to 3); and

[Chemical Formula 6]

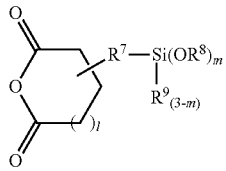

(3)

(wherein l represents an integer of 0 to 2, m represents an integer of 0 to 2, $R^7$ represents an alkylene group having 1 to 4 carbon atoms, $R^8$s each independently represent hydrogen or an alkyl group having 1 to 4 carbon atoms, and $R^9$s each independently represent an alkyl group having 1 to 6 carbon atoms).

Examples of the compounds represented by the general formula (1) include dimethoxydimethylsilane, diethoxydimethylsilane, dimethoxydiphenylsilane, diethoxydiphenylsilane, dihydroxy(diphenyl)silane, dimethoxy(methyl)(phenyl)silane, diethoxy(methyl)(phenyl)silane, dimethoxy(methyl)(phenethyl)silane, dicyclopentyldimethoxysilane and cyclohexyldimethoxy(methyl)silane, and dimethoxydiphenylsilane, diethoxydiphenylsilane and dihydroxy(diphenyl)silane are preferred in order to improve the crack resistance.

A percentage of the compound represented by the general formula (1) in the alkoxysilane compound subjected to the co-hydrolyzate condensation is preferably 25 to 75% by mole. When the percentage of the compound represented by the general formula (1) is less than 10% by mole, crack resistance is deteriorated, and a thickness of a cured film which can be formed at a time is restricted. On the other hand, when the percentage of the compound is more than 75% by mole, chemical resistance of the resulting cured film is deteriorated. Further, a percentage of dimethoxydiphenylsilane, diethoxydiphenylsilane and dihydroxy(diphenyl)silane in the alkoxysilane compound subjected to the co-hydrolyzate condensation is preferably 10 to 45% by mole.

Examples of the compound represented by the general formula (2) include 3-methacryloxypropyltrimethoxysilane, 3-methacryloxypropyltriethoxysilane, 3-acryloxypropyltrimethoxysilane, 3-methacryloxypropylmethyldimethoxysilane, 3-methacryloxypropylmethyldiethoxysilane, 3-acryloxypropylmethyldimethoxysilane, 3-acryloxypropyltriethoxysilane, and 3-acryloxypropylmethyldiethoxysilane. A percentage of the compound represented by the general formula (2) in the alkoxysilane compounds subjected to the co-hydrolyzate condensation is preferably 10 to 45% by mole. When the percentage of the compound represented by the general formula (2) is less than 10% by mole, chemical resistance is deteriorated. On the other hand, when the percentage of the compound is more than 45% by mole, heat resistance is deteriorated.

Examples of the compound represented by the general formula (3) include 3-trimethoxysilylpropylsuccinic anhydride, 3-triethoxysilylpropylsuccinic anhydride, 3-trimethoxysilylethylsuccinic anhydride and 3-trimethoxysilylbutylsuccinic anhydride, 3-(diethoxymethylsilyl)propylsuccinic anhydride, 3-(dimethoxymethylsilyl)ethylsuccinic anhydride and 3-(dimethoxymethylsilyl)butylsuccinic anhydride. A percentage of the compound represented by the general formula (3) in the alkoxysilane compound subjected to the co-hydrolyzate condensation is preferably 1 to 20% by mole. When the percentage of the compound represented by the general formula (3) is less than 1% by mole, a margin against development residue is reduced. On the other hand, when the percentage of the compound is more than 20% by mole, chemical resistance is deteriorated.

The alkoxysilane compound subjected to the co-hydrolyzate condensation preferably further contains the compound represented by the general formula (5) in order to improve chemical resistance of the resulting cured film. Examples of the compound represented by the general formula (5) include 3-glycidyloxypropyltrimethoxysilane, glycidyloxypropyltriethoxysilane, 3-(3,4-epoxycyclohexyl)propyltrimethoxysilane, and 3-(3,4-epoxycyclohexyl)propyltriethoxysilane. A percentage of the compound represented by the general formula (5) in the alkoxysilane compound subjected to the co-hydrolyzate condensation is preferably 10% by mole or less. When the percentage of the compound represented by the general formula (5) is more than 10% by mole, heat resistance is deteriorated.

[Chemical Formula 7]

$$R^{12}Si(OR^{13})_3 \qquad (5)$$

($R^{12}$ represents a monovalent organic group having an epoxy group, and $R^{13}$s each independently represent an alkyl group having 1 to 4 carbon atoms.)

Examples of alkoxysilane compounds other than above-mentioned compounds represented by the general formulas (1) to (3) and (5) include methyltrimethoxysilane, ethyltrimethoxysilane, phenyltrimethoxysilane, phenethyltrimethoxysilane, naphthyltrimethoxysilane, methyltriethoxysilane, ethyltriethoxysilane, phenyltriethoxysilane, phenethyltriethoxysilane, naphthyltriethoxysilane, tetramethoxysilane and tetraethoxysilane.

(B) The polysiloxane contained in a thermosetting coloring composition of the present invention is obtained by co-hydrolyzate condensation, i.e., by hydrolysis and partial condensation, of an alkoxysilane compound containing a compound represented by the general formula (1), a compound represented by the general formula (2) and a compound represented by the general formula (3). A common method can be used for the co-hydrolyzate condensation. For example, a method, in which an organic solvent, water and a catalyst as required are added to a mixture, and the resulting mixture is heated/stirred at 50 to 150° C. for about 0.5 to 100 hours, can be used. In addition, during heating/stirring, as required, the hydrolysis by-product (alcohols such as methanol) and condensation by-product (water) may be distilled off.

An organic solvent to be used for the co-hydrolyzate condensation is preferably the same as (C) the organic solvent contained in the thermosetting coloring composition of the present invention. The addition amount of the organic solvent is preferably 10 to 1000 parts by mass with respect to 100 parts by mass of the alkoxysilane compound subjected to the co-hydrolyzate condensation. Further, the addition amount of water is preferably 0.5 to 2 moles with respect to 1 mole of a hydrolyzable group.

The catalyst added to co-hydrolyzate condensation as required is preferably an acid catalyst or a basic catalyst. Examples of the acid catalysts include acetic acid, trifluoroacetic acid, formic acid, polyhydric carboxylic acid or anhydride thereof, hydrochloric acid, nitric acid, sulfuric acid, hydrofluoric acid, phosphoric acid, and an ion-exchange resin. Examples of the basic catalyst include triethylamine, tripropylamine, tributylamine, tripentylamine, trihexylamine, triheptylamine, trioctylamine, diethylamine, triethanolamine, diethanolamine, sodium hydroxide, potassium hydroxide, alkoxy silane having an amino group and an ion-exchange resin. An addition amount of the catalyst is preferably 0.01 to 10 parts by mass with respect to 100 parts by mass of the alkoxysilane compound subjected to the co-hydrolyzate condensation.

Moreover, the added catalyst may be removed as required. Examples of the method for removing a catalyst include washing with water or treatment with an ion-exchange resin. Herein, washing with water refers to a method in which the polysiloxane solution is diluted with an adequate hydrophobic solvent and is washed with water several times and the resulting organic layer is concentrated using an evaporator. Treatment with an ion-exchange resin refers to a method in which the polysiloxane solution is brought into contact with an adequate ion-exchange resin.

The weight average molecular weight (hereinafter, "Mw") of the polysiloxane obtained by the co-hydrolyzate condensation is preferably 500 to 10000, and more preferably 700 to 5000 on the polystyrene equivalent basis measured by GPC (gel permeation chromatography). When the Mw is smaller than 700, development peeling of a micro pattern occurs during developing. On the other hand, when the Mw is larger than 10000, development residue is generated in the case of a short developing time.

The negative-type photosensitive coloring composition of the present invention contains (A) a white pigment. Herein, (A) the white pigment refers to an opaque pigment which does not have a specific absorption in a visible range and has a large refractive index. Examples of (A) the white pigment include titanium dioxide, magnesium oxide, zinc oxide and white lead, and titanium dioxide which is excellent in a shielding property and is easily industrially used, is preferred, and examples of a crystal structure of the titanium dioxide include an anatase type, a rutile type and a brookite type, and among these type, the rutile type titanium oxide is preferred since it does not have photocatalyst activity. Moreover, titanium dioxide in which the surface of a particle is treated is more preferred in order to improve dispersibility in the negative-type photosensitive coloring composition and lightfastness and heat resistance of the cured film.

As a surface treating agent, metal oxides and/or hydrates of metal oxides are preferred, and $Al_2O_3$, $SiO_2$ and/or $ZrO_2$ is more preferred. Particularly, it is preferred to contain $SiO_2$ from the viewpoint of lightfastness and heat resistance. A mass ratio of the surface treating agent in the titanium oxide particles surface treated is preferably 10% by mass or less from the viewpoint of a shielding property. In order to improve color characteristics of a cured film, an average primary particle diameter of the titanium oxide described above is preferably 0.1 to 0.5 μm, and more preferably 0.2 to 0.3 μm. When the average primary particle diameter is less than 0.1 μm, the shielding property is deteriorated, and on the other hand, when the average primary particle diameter is more than 0.5 μm, a white cured film bears yellow.

Examples of a titanium dioxide pigment include CR-97; manufactured by ISHIHARA SANGYO KAISHA, LTD. (rutile type, treated with $Al_2O_3/ZrO_2$, average primary particle size 0.25 μm), JR-301; manufactured by Tayca Corporation (rutile type, treated with $Al_2O_3$, average primary particle size 0.30 μm), JR-405; manufactured by Tayca Corporation (rutile type, treated with $Al_2O_3$, average primary particle size 0.21 μm), JR-600A; manufactured by Tayca Corporation (rutile type, treated with $Al_2O_3$, average primary particle size 0.25 μm), JR-603; manufactured by Tayca Corporation (rutile type, treated with $Al_2O_3/ZrO_2$, average primary particle size 0.28 μm), and R960; manufactured by Du Pont Co. (rutile type, treated with $SiO_2$/$Al_2O_3$, average primary particle size 0.21 μm).

The addition amount of (A) the white pigment is preferably 20 to 300 parts by mass, and more preferably 50 to 150 parts by mass with respect to 100 parts by mass of a total of (B) the polysiloxane and (C) the polyfunctional acrylic monomer. When the amount of (A) the white pigment is less than 20 parts by mass, a sufficient shielding property is not achieved. On the other hand, when the amount is more than 300 parts by mass, chemical resistance of the resulting cured film is deteriorated.

The negative-type photosensitive coloring composition of the present invention may contain a coloring agent other than (A) a white pigment. Examples of the coloring agent other than (A) a white pigment include dyes, organic pigments and inorganic pigments, and phthalocyanine-based organic pigments, carbon black and inorganic pigments are preferred from the viewpoint of heat resistance.

Examples of the organic pigment include yellow organic pigments such as Pigment Yellow-12, 13, 17, 20, 24, 83, 86, 93, 95, 109, 110, 117, 125, 129, 137, 138, 139, 147, 148, 150, 153, 154, 166, 168 and 185; orange organic pigments such as Pigment Orange-13, 36, 38, 43, 51, 55, 59, 61, 64, 65 and 71; red organic pigments such as Pigment Red-9, 48, 97, 122, 123, 144, 149, 166, 168, 177, 179, 180, 192, 209, 215, 216, 217, 220, 223, 224, 226, 227, 228, 240 and 254; violet organic pigments such as Pigment Violet-19, 23, 29, 30, 32, 37, 40 and 50; blue organic pigments such as Pigment Blue-15, 15:3, 15:4, 15:6, 22, 60 and 64; green organic pigments such as Pigment Green-7, 10 and 36; and black organic pigments such as carbon black, perylene black and aniline black (the numerical values each indicate a color index (CI) number); however, Pigment Blue 15:3, Pigment Blue 15:4, Pigment Blue 15:6, Pigment Green 7, Pigment Green 36 and carbon black are preferred from the viewpoint of general versatility and heat resistance.

These organic pigments may be subjected to surface treatment such as rosin treatment, acid group treatment or basic group treatment, as required.

Examples of inorganic pigments include metal fine particles, metal oxides, composite oxides, metal sulfides, metal nitrides and metal acid nitride, such as iron oxide, cadmium sulfide, titanium nickel antimony, titanium nickel barium, strontium chromate, viridian, chromium oxide, cobalt (II) alminate and titanium nitride. These inorganic pigments may be surface treated with another inorganic component or organic component; however, inorganic pigment are preferably surface treated with another inorganic component from the viewpoint of heat resistance.

On the other hand, when the negative-type photosensitive transparent material of the present invention does not contain a coloring agent other than (A) a white pigment, since (A) the white pigment is lower in a shielding property than a coloring agent of other color, it is necessary to set the thickness of the resulting cured film to 10 μm or more, preferably 15 μm or more, and more preferably 20 μm or more. In this case, the crack resistance of the resulting cured film becomes very important.

The negative-type photosensitive coloring composition of the present invention may contain a pigment dispersant in order to improve dispersibility.

The negative-type photosensitive coloring composition of the present invention contains (C) a polyfunctional acrylic monomer. Herein, (C) the polyfunctional acrylic monomer refers to a compound having a plurality of (meth)acryloyl groups.

(C) Examples of the polyfunctional acrylic monomers include bisphenol A diglycidyl ether (meth)acrylate, poly (meth)acrylate carbamate, modified bisphenol A epoxy (meth)acrylate, adipic acid 1,6-hexanediol (meth)acrylate, phthalic anhydride propylene oxide (meth)acrylate, trimellitic acid diethylene glycol (meth)acrylate, rosin-modified epoxy di(meth)acrylate, oligomers such as alkyd-modified (meth)acrylate, tripropylene glycol di(meth)acrylate, 1,6-hexanediol di(meth)acrylate, bisphenol A diglycidyl ether di(meth)acrylate, trimethylolpropane tri(meth)acrylate, pentaerythritol tri(meth)acrylate, triacrylformal, pentaerythritol tetra(meth)acrylate, dipentaerythritol hexa(meth)acrylate, dipentaerythritol penta(meth)acrylate, tripentaerythritol hepta(meth)acrylate, tripentaerythritol octa(meth)acrylate, [9,9-bis[4-(2-acryloyloxyethoxy]phenyl]fluorene, ethoxylated isocyanurate diacrylate, ethoxylated isocyanurate triacrylate and ε-caprolactone modified tris-(2-acryloxyethyl) isocyanurate; however, the compounds represented by the following general formula (4) are preferred in order to improve the crack resistance of the resulting cured film. Examples of the compound represented by the general formula (4) include ethoxylated isocyanurate diacrylate, ethoxylated isocyanurate triacrylate and ε-caprolactone modified tris-(2-acryloxyethyl)isocyanurate.

[Chemical Formula 8]

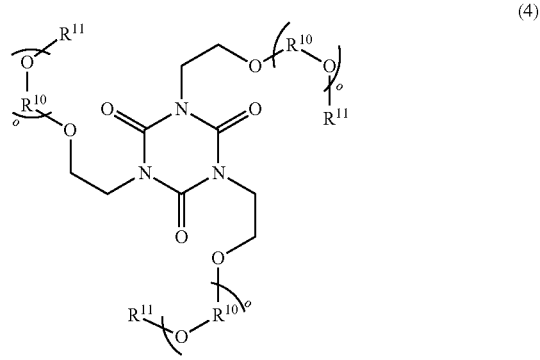

(4)

(wherein $R^{10}$ represents an alkylene group having 1 to 4 carbon atoms, o each independently represent an integer of 0 to 5, and $R^{11}$s each independently represent an acryloyl group, a methacryloyl group or hydrogen, and not all $R^{11}$ are hydrogen).

The negative-type photosensitive coloring composition of the present invention contains (D) a photoradical polymerization initiator. Herein, (D) the photoradical polymerization initiator refers to one which decomposes and/or reacts upon exposure to light (including ultraviolet ray and electron beam) to generate radicals.

(D) Examples of the photoradical polymerization initiator include 2-methyl-1-(4-methylthiophenyl)-2-morpholinopropan-1-one, 2-benzyl-2-(dimethylamino)-1-(4-morpholinophenyl)butan-1-one, 2-(dimethylamino)-2-[(4-methylphenyl)methyl]-1-[4-(4-morpholinophenyl)-1-butan-1-one, (2,4,6-trimethylbenzoyl)phenylphosphine oxide, bis(2,4,6-trimethylbenzoyl)phenylphosphine oxide, bis(2,6-dimethoxybenzoyl)(2,4,4-trimethylpentyl)phosphine oxide, 1,2-octanedione, 1-[4-(phenylthio)-2-(O-benzoyloxime)], ethanone, 1-[9-ethyl-6-(2-methylbenzoyl)-9H-carbazol-3-yl]1-(O-acetyloxime), 2,2-dimethoxy-1,2-diphenylethan-1-one and 1-hydroxycyclohexyl phenyl ketone.

When the negative-type photosensitive transparent material of the present invention does not contain a coloring agent other than (A) a white pigment, acylphosphine oxide-based photopolymerization initiators, such as (2,4,6-trimethylbenzoyl)phenylphosphine oxide, bis(2,4,6-trimethylbenzoyl)phenylphosphine oxide and bis(2,6-dimethoxybenzoyl)(2,4,4-trimethylpentyl)phosphine oxide, are preferred in order to suppress coloring by the photosensitive agent.

The negative-type photosensitive coloring composition of the present invention contains (E) an organic solvent. (E) The organic solvent is preferably alcoholic compounds, ester compounds or ether compounds because they are able to dissolve each component in the composition uniformly, and ester compounds or ether compounds are more preferred from the viewpoint of pigment dispersibility. Further, compounds having a boiling point of 110 to 250° C. under atmospheric pressure are preferred. Since the negative-type photosensitive coloring composition of the present invention is thought to be applied by a printing method such as spin coating, slit coating, screen printing, ink-jet printing or bar coating, when the composition has a boiling point lower than 110° C., a drying speed of the organic solvent is fast and defective uniformity of application easily occurs. On the other hand, when the boiling point is higher than 250° C., the organic solvent remains in the resulting cured film, resulting in deterioration of heat resistance of the cured film.

(E) Examples of the organic solvents include propylene glycol monomethyl ether, propylene glycol monomethyl ether acetate, diacetone alcohol, ethylene glycol mono-n-butyl ether, 2-ethoxyethyl acetate, 1-methoxypropyl-2-acetate, 3-methoxy-3-methylbutanol, 3-methoxy-3-methylbutanol acetate, 3-methoxybutyl acetate, 1,3-butylene glycol diacetate, ethylene glycol monobutyl ether acetate, diethylene glycol monobutyl ether acetate, ethyl lactate, butyl lactate, ethyl acetoacetate and γ-butyrolactone.

The thermosetting coloring composition of the present invention may contain a surfactant for improving coating properties. Examples of the surfactant include fluorochemical surfactants, silicone surfactants, polyalkylene oxide base surfactants and poly(meth)acrylate base surfactants.

The negative-type photosensitive coloring composition of the present invention may contain (F) a polyfunctional thiol compound. Containing (F) the polyfunctional thiol compound makes a taper shape of a pattern edge mild. Further, adhesion to glass is improved and development peeling can be suppressed. Moreover, resistance to chemical treatment at a subsequent step can be improved.

The addition amount of (F) the polyfunctional thiol compound is preferably 0.1 to 5 parts by mass with respect to 100 parts by mass of a total of (B) the polysiloxane and (C) the polyfunctional acrylic monomer. When the addition amount of (F) the polyfunctional thiol compound is less than 0.1 part by mass, the effect of improving the chemical resistance cannot be adequately achieved, and when the addition amount is more than 5 parts by mass, odor peculiar to the thiol compound becomes strong during exposure to light.

As (F) the polyfunctional thiol compound, an ester compound formed between a polyhydric alcohol compound and a carboxylic compound having a secondary or tertiary mercapto group is preferred from the viewpoint of storage stability of the composition.

Examples of the polyhydric alcohol compound include alkylene glycol (the number of carbon atoms of the alkylene group is 2 to 10 and the alkylene may be branched), diethylene glycol, dipropylene glycol, glycerin, trimethylolpropane, tris(2-hydroxyethyl) isocyanurate, pentaerythritol and dipentaerythritol.

Examples of the carboxylic compound having a secondary or tertiary mercapto group include 2-mercaptopropionic acid, 3-mercaptobutanoic acid, 2-mercaptoisobutanoic acid, 4-mercaptopentanoic acid and 3-mercaptopentanoic acid.

Examples of these thiol compounds include pentaerythritol tetrakis(2-mercaptopropionate), trimethylolpropanetris(2-mercaptopropionate), trimethylolethanetris(2-mercaptopropionate), glycerin tris(2-mercaptopropionate), tris(2-mercaptopropionate)ethoxyisocyanurate, ethyleneglycol bis(2-mercaptopropionate), 1,2-propyleneglycol (2-mercaptopropionate), 1,4-butyleneglycol (2-mercaptopropionate), diethylene glycol bis(2-mercaptopropionate), dipropylene glycol bis(2-mercaptopropionate), pentaerythritol tetrakis(3-mercaptobutyrate), trimethylolpropanetris(3-mercaptobutyrate), trimethylolethanetris(3-mercaptobutyrate), glycerin tris(3-mercaptobutyrate), tris(3-mercaptobutyrate)ethoxyisocyanurate, ethyleneglycol bis(3-mercaptobutyrate), 1,2-propyleneglycol (3-mercaptobutyrate), 1,4-butyleneglycol (3-mercaptobutyrate), diethylene glycol bis(3-mercaptobutyrate), dipropylene glycol bis(3-mercaptobutyrate), pentaerythritol tetrakis(2-mercaptoisobutyrate), trimethylolpropanetris(2-mercaptoisobutyrate), trimethylolethanetris(2-mercaptoisobutyrate), glycerin tris(2-mercaptoisobutyrate), tris(2-mercaptoisobutyrate)ethoxyisocyanurate, ethyleneglycol bis(2-mercaptoisobutyrate), 1,2-propyleneglycol bis(2-mercaptoisobutyrate), trimethylolpropanetris(2-mercaptoisobutyrate), 1,2-propyleneglycol (2-mercaptoisobutyrate), 1,4-butyleneglycol (2-mercaptoisobutyrate), diethylene glycol bis(2-mercaptoisobutyrate) and dipropylene glycol bis(2-mercaptoisobutyrate); however, pentaerythritol tetrakis(3-mercaptobutyrate), trimethylolpropanetris(3-mercaptobutyrate), trimethylolethanetris(3-mercaptobutyrate), glycerin tris(3-mercaptobutyrate), and tris(3-mercaptobutyrate)ethoxyisocyanurate are preferred since they are excellent in a balance among odor, storage stability and reactivity.

Examples of other thiol compounds include 1,4-butanedithiol, 1,5-pentanedithiol, 1,6-hexanedithiol, 1,9-nonanedithiol, pentaerythritol tetrakis(3-mercaptopropionate), trimethylolpropanetris(3-mercaptopropionate), trimethylolethanetris(3-mercaptopropionate), glycerintris(3-mercaptopropionate), tris(3-mercaptopropionate)ethoxy isocyanurate, ethyleneglycol bis(3-mercaptopropionate), 1,2-propylene glycol (3-mercaptopropionate), 1,4-butylene glycol (3-mercaptopropionate), diethylene glycol bis(3-mercaptopropionate) and dipropylene glycol bis(3-mercaptopropionate). When the polyfunctional thiol compound is added to the negative-type photosensitive coloring composition of the present invention, they may be used singly or may be used as a mixture thereof.

The negative-type photosensitive coloring composition of the present invention may contain (G) an alicyclic epoxy compound in order to further improve chemical resistance. (G) the alicyclic epoxy compound can suppress yellowing after additional heating treatment while improving the chemical resistance since it has high heat resistance.

The addition amount of (G) the alicyclic epoxy compound is preferably 0.1 to 15 parts by mass with respect to 100 parts by mass of a total of (B) the polysiloxane and (C) the polyfunctional acrylic monomer. When the addition amount of (G) the alicyclic epoxy compound is less than 0.1 part by mass, the effect of improving the adhesion may be not adequately achieved, and when the addition amount is more than 15 parts by mass, the storage stability of the composition may be deteriorated to make the handling of the composition difficult.

Examples of (G) the alicyclic epoxy compound include 3',4'-epoxycyclohexylmethyl 3,4-epoxycyclohexane carboxylate, 1,2-epoxy-4-(2-oxiranyl)cyclohexane addition product of 2,2-bis(hydroxymethyl)-1-butanol, ε-caprolactone-modified 3',4'-epoxycyclohexylmethyl 3',4'-epoxycyclohexanecarboxylate, 1,2-epoxy-4-vinylcyclohexane, tetra (3,4-epoxycyclohexylmethyl)butanetetracarboxylate modified ε-caprolactone, 3,4-epoxycyclohexylmethyl methacrylate, hydrogenated bisphenol A diglycidyl ether, hydrogenated bisphenol F diglycidyl ether, hydrogenated bisphenol E diglycidyl ether, hydrogenated bisphenol A bis (propylene glycol glycidyl ether)ether, hydrogenated bisphenol A bis(ethylene glycol glycidyl ether)ether, 1,4-cyclohexane dicarboxylic acid diglycidyl and 1,4-cyclohexane dimethanol diglycidyl ether. When (G) the alicyclic epoxy compound is added to the negative-type photosensitive coloring composition of the present invention, they may be used singly or may be used as a mixture thereof.

The negative-type photosensitive coloring composition of the present invention may contain (H) the silane coupling agent represented by the following general formula (6) in order to improve adhesion. The addition amount of (H) the silane coupling agent represented by the following general formula (6) is preferably 0.1 to 15 parts by mass with respect to 100 parts by mass of a total of (B) the polysiloxane and (C) the polyfunctional acrylic monomer. When the addition amount of (H) the silane coupling agent represented by the following general formula (6) is less than 0.1 part by mass, the effect of improving the adhesion may be not adequately achieved, and when the addition amount is more than 15 parts by mass, the cured film may cause yellowing.

[Chemical Formula 9]

$$H_p\!\!>\!\!\!\!\underset{R^{14}_{(3-p)}}{C}\!\!-\!\!\underset{HO-\underset{\|}{C}\!\!-}{NH-\underset{\|}{C}\!\!-}R^{15}SiR^{16}_3 \qquad (6)$$

(in which $R^{14}$s each independently represent an alkyl group having 1 to 6 carbon atoms or a substituted group thereof, p represents 0 or 1, $R^{15}$ represents a trivalent organic group having 3 to 30 carbon atoms, and $R^{16}$s each independently represent an alkyl group having 1 to 6 carbon atoms, an alkoxy group having 1 to 6 carbon atoms, a phenyl group or a phenoxy group, or substituted groups thereof).

Herein, $R^{14}$ is preferably a methyl group, an ethyl group or a butyl group, and preferably a methyl group or an ethyl group particularly in point of raw material availability. $R^{15}$ is preferably an alkyl group, and preferably an alkyl group having 3 to 10 carbon atoms particularly in point of solubility in an organic solvent.

(H) Examples of the silane coupling agent represented by the above-mentioned general formula (6) include 3-(tert-butylcarbamoyl)-6-(trimethoxysilyl)hexanoic acid, 2-[2-(tert-butylamino)-2-oxoethyl]-5-(trimethoxysilyl)pentanoic acid, 3-(isopropylcarbamoyl)-6-(trimethoxysilyl)hexanoic acid, 2-[2-(isopropylamino)-2-oxoethyl]-5-(trimethoxysilyl) pentanoic acid, 3-(isobutylcarbamoyl)-6-(trimethoxysilyl) hexanoic acid, 2-[2-(isobutylamino)-2-oxoethyl]-5-(trimethoxysilyl)pentanoic acid, 3-(tert-pentylcarbamoyl)-6-(trimethoxysilyl)hexanoic acid, 2-[2-(tert-pentylamino)-2-oxoethyl]-5-(trimethoxysilyl)pentanoic acid, 3-(tert-butylcarbamoyl)-6-(triethoxysilyl)hexanoic acid, 2-[2-(tert-butylamino)-2-oxoethyl]-5-(triethoxysilyl)pentanoic acid, 6-(dimethoxy(methyl)silyl)-3-(tert-butylcarbamoyl) hexanoic acid, 5-(dimethoxy(methyl)silyl)-2-[2-(tert-butylamino)-2-oxoethyl]pentanoic acid, 3-(tert-butylcarbamoyl)-6-(trimethoxysilyl)pentanoic acid, 2-[2-(tert-butylamino)-2-oxoethyl]-5-(trimethoxysilyl)butanoic acid, 2-(tert-butylcarbamoyl)-4-(2-(trimethoxysilyl)ethyl)cyclohexane hexanecarboxylic acid, 2-(tert-butylcarbamoyl)-5-(2-(trimethoxysilyl)ethyl)cyclohexane hexanecarboxylic acid and the like. Among these, particularly, 3-(tert-butylcarbamoyl)-6-(trimethoxysilyl)hexanoic acid, 2-[2-(tert-butylamino)-2-oxoethyl]-5-(trimethoxysilyl)pentanoic acid, 3-(isopropylcarbamoyl)-6-(trimethoxysilyl)hexanoic acid, 3-(tert-pentylcarbamoyl)-6-(trimethoxysilyl)hexanoic acid, 2-[2-(tert-pentylamino)-2-oxoethyl]-5-(trimethoxysilyl) pentanoic acid, 3-(tert-butylcarbamoyl)-6-(triethoxysilyl) hexanoic acid, 2-[2-(tert-butylamino)-2-oxoethyl]-5-(triethoxysilyl)pentanoic acid, 6-(dimethoxy(methyl)silyl)-3-(tert-butylcarbamoyl)hexanoic acid, 5-(dimethoxy(methyl) silyl)-2-[2-(tert-butylamino)-2-oxoethyl]pentanoic acid, 3-(tert-butylcarbamoyl)-6-(trimethoxysilyl)pentanoic acid, 2-[2-(tert-butylamino)-2-oxoethyl]-5-(trimethoxysilyl)butanoic acid, 2-(tert-butylcarbamoyl)-4-(2-(trimethoxysilyl) ethyl)cyclohexane hexanecarboxylic acid, and 2-(tert-butylcarbamoyl)-5-(2-(trimethoxysilyl)ethyl)cyclohexane hexanecarboxylic acid are preferred in that n is 0 in the general formula (6) and the effect of improving the adhesiveness of ITO is enhanced.

When the silane coupling agents represented by the above-mentioned general formula (6) are added to the negative-type photosensitive coloring composition of the present invention, they may be used singly or may be used as a mixture thereof.

By the reaction of an acid anhydride containing a trimethoxysilylpropyl group with alkylamine, but not limited to this, the silane coupling agent can be easily synthesized. Thus, these silane coupling agents are preferably used in a pair produced during synthesis, for example, in a combination of 3-(tert-butylcarbamoyl)-6-(trimethoxysilyl) hexanoic acid and 2-[2-(tert-butylamino)-2-oxoethyl]-5-(trimethoxysilyl)pentanoic acid.

As more preferable combination, from the viewpoint of ease of raw material availability, a combination of 3-(tert-butylcarbamoyl)-6-(trimethoxysilyl)hexanoic acid and 2-[2-(tert-butylamino)-2-oxoethyl]-5-(trimethoxysilyl)pentanoic acid, or a combination of 3-(tert-pentylcarbamoyl)-6-(trimethoxysilyl)hexanoic acid and 2-[2-(tert-pentylamino)-2-oxoethyl]-5-(trimethoxysilyl)pentanoic acid is preferred.

The negative-type photosensitive coloring composition of the present invention may contain (I) an ultraviolet absorber. Containing (I) a ultraviolet absorber improves the resolution while maintaining a tapered shape at a patterned edge portion. The addition amount of (I) the ultraviolet absorber is preferably 0.01 to 10 parts by mass, and more preferably 0.1 to 5 parts by mass with respect to 100 parts by mass of a total of (B) the polysiloxane and (C) the polyfunctional acrylic monomer. When the addition amount of (I) the ultraviolet absorber is less than 0.01 part by mass, the effect of improving pattern-shape control may be not adequately achieved, and when the addition amount is more than 10 parts by mass, the cured film may cause yellowing.

(I) The ultraviolet absorber is preferably a benzotriazole compound, a benzophenone compound or a triazine compound from the viewpoint of transparency or non-stainability, and a triazine compound is more preferred from the viewpoint of heat resistance.

Examples of the ultraviolet absorber made of a benzotriazole compound include 2-(2H-benzotriazol-2-yl)phenol, 2-(2H-benzotriazol-2-yl)-4,6-tert-pentylphenol, 2-(2H-benzotriazol-2-yl)-4-(1,1,3,3-tetramethylbutyl)phenol, 2(2H-benzotriazol-2-yl)-6-dodecyl-4-methylphenol, 2-(2'-hydroxy-5'-methacryloxyethylphenyl)-2H-benzotriazole, 2-(2H-benzotriazol-2-yl)-4,6-bis(1-methyl-1-phenylethyl) phenol, 2-(2H-benzotriazol-2-yl)-4-methyl-6-(3,4,5,6-tetrahydrophthalimide-yl-methyl)phenol and 2-(2H-benzotriazol-2-yl)-6-(1-methyl-1-phenylethyl)-4-(1,1,3,3-tetramethylbutyl)phenol, and 2-(2H-benzotriazol-2-yl)-4-methyl-6-(3,4,5,6-tetrahydrophthalimide-yl-methyl)phenol is more preferred from the viewpoint of heat resistance.

Examples of the ultraviolet absorber made of a benzophenone compound include 2-hydroxy-4-methoxybenzophenone. Examples of the ultraviolet absorber made of a triazine compound include 2-(4,6-diphenyl-1,3,5-triazin-2-yl)-5-[(hexyl)oxy]-phenol, a reaction product of 2-(4,6-bis (2,4-dimethylphenyl)-1,3,5 triazin-2-yl-5-hydroxyphenyl and oxirane[(C10-C16 principally C12-C13 alkyloxy)methyl]oxirane, 2-[2-hydroxy-4-[3-(2-ethylhexyl-1-oxy)-2-hydroxypropyloxy]phenyl]-4,6-bis(2,4-dimethylphenyl)-1,3, 5-triazine, 2,4-bis[2-hydroxy-4-butoxyphenyl]-6-(2,4-dibutoxyphenyl)-1,3,5-triazine, 2-ethylhexyl-2-(4-(4,6-di ([1,1'-biphenyl]-4-yl)-1,3,5-triazine-2-yl)-3-hydroxyphenoxy) propanoate and trioctyl-2,2',2"-(((1,3,5-triazine-2,4,6-tolyl)tris(3-hydroxybenzene-4,1-diyl))tris (oxy))tripropanoate.

The negative-type photosensitive coloring composition of the present invention may contain (J) a radical scavenger. By the antioxidant effect of (J) the radical scavenger, yellowing after heating treatment at the subsequent step is suppressed and lightfastness is improved.

The addition amount of (J) the radical scavenger is preferably 0.01 to 10 parts by mass, and more preferably 0.15 part by mass or less with respect to 100 parts by mass of a total of (B) the polysiloxane and (C) the polyfunctional acrylic monomer. When the addition amount of (J) the radical scavenger is less than 0.01 part by mass, the effect of improving pattern-shape control may be not adequately achieved, and when the addition amount is more than 10 parts by mass, the cured film may cause yellowing.

(J) As the radical scavenger, a hindered phenol compound or a hindered amine compound which has a Mw of 300 or more or has a radical polymerizable group is preferred because of its excellent effect of suppressing discoloration of the cured film. When these compounds have the Mw of less than 300 and do not contain the radical polymerizable group, sometimes, these compounds are sublimated during thermal curing and do not achieve a sufficient antioxidant effect. Further, the number of phenol groups or amino groups in a molecule is preferably 2 or more, and more preferably 4 or more because they easily achieve the effect of trapping radicals.

Examples of the hindered phenol compound include tert-butylpyrocatechol, dibutylhydroxytoluene, octadecyl 3-(3, 5-di-t-butyl-4-hydroxyphenyl) propionate, hexamethylenebis[3(3,5-di-t-butyl-4-hydroxyphenyl propionate, thiodiethylenebis[3(3,5-di-t-butyl-4-hydroxyphenyl propionate, ethylenebis(oxyethylene)bis(3-(5-t-butyl-4-hydroxy-m-tolyl) propionate, tris-(3,5-di-t-butyl-4-hydroxybenzyl)-isocyanurate, 1,3,5-trimethyl-2,4,6-tris(3,5-di-t-butyl-4-hydroxybenzyl)benzene, pentaerythritol tetrakis(3-(3,5-di-t-butyl-4-hydroxyphenyl)propionate, 2-t-butyl-6-(3-t-butyl-2-hydroxy-5-methylbenzyl)-4-methylphenyl acrylate, 2-[1-(2-hydroxy 3,5-di-t-pentylphenyl)ethyl]-4,6-di-t-pentylphenyl acrylate, 2,2'-methylenebis(6-t-butyl-4-methylphenol and 4,4'-butylidenebis(6-t-butyl-3-methylphenol).

Examples of the hindered amine compound include bis (1,2,2,6,6-pentamethyl-4-piperidyl) [[3,5-bis(1,1-dimethyl-ethyl)-4-hydroxyphenyl]methyl]butylmalonate, bis(1,2,2,6, 6-pentamethyl-4-piperidyl) sebacate, methyl-1,2,2,6,6-pentamethyl-4-piperidyl sebacate, 1,2,2,6,6-pentamethyl-4-piperidyl methacrylate, 2,2,6,6-tetramethyl-4-piperidyl methacrylate, reaction products between bis-(2,2,6,6-tetramethyl-1-octyloxy-4-piperidinyl) sebacate, 1,1-dimethylethyl hydroperoxide and octane, tetrakis(1,2,2,6,6-pentamethyl-4-pyridyl)butane-1,2,3,4-tetracarboxylate and tetrakis (2,2,6,6-tetramethyl-4-pyridyl)butane-1,2,3,4-tetra carboxylate.

A typical method for producing the negative-type photosensitive coloring composition of the present invention will be described below. First, a mixed liquid of (A) a white pigment, (B) a polysiloxane and (E) an organic solvent is dispersed with use of a mill-type disperser loaded with zirconia beads to obtain a pigment dispersion. On the other hand, (B) a polysiloxane, (C) a polyfunctional acrylic monomer, (D) a photoradical polymerization initiator and (E) an organic solvent and other additives are dissolved by stirring to prepare a diluted solution. Then, the dispersion and the diluted solution are mixed, and the resulting mixture is stirred and filtrated to obtain a negative-type photosensitive coloring composition.

It is preferred that a method of forming a cured film formed by curing the negative-type photosensitive coloring composition of the present invention undergoes the following five steps (i) to (v) because manufacturing equipment of a display and a semiconductor can be used as-is.

(i) Step of Applying Negative-Type Photosensitive Coloring Composition onto Substrate Examples of methods of applying the composition include spin coating, slit coating, screen printing, ink-jet printing and bar coating.

(ii) Step of Drying (Pre-Baking) Coated Substrate by Reducing Pressure and/or Heating.

Examples of the heating method include heating devices such as a hot plate and an oven. Heating is commonly carried out under the condition of a temperature of 60 to 15° C. and a heating time of 30 seconds to 3 minutes. The film thickness pre-baked after drying is preferably 5 to 30 µm.

(iii) Step of Exposing Dried Substrate to Light Through Mask

Examples of an exposure method include a method of using an exposer such as a stepper, a mirror projection mask aligner (MPA), or a parallel light mask aligner (hereinafter referred to as "PLA"). With respect to exposure conditions, an exposure intensity is commonly about 10 to about 4000 J/m$^2$ (on the exposure amount at wavelength 365 nm equivalent basis). Examples of an exposure light source include ultraviolet light such as i-ray, g-ray or h-ray, KrF (wavelength: 248 nm) laser or ArF (wavelength: 193 nm) laser or the like.

(iv) Step of Developing Exposed Substrate with Use of Developing Solution to Form Pattern As a development method, a method, in which the exposed photosensitive composition is immersed in a developing solution for 5 seconds to 10 minutes by a method such as showering, dipping or paddling, is preferred. Examples of the developing solution include aqueous solutions of inorganic alkalis such as hydroxides, carbonates, phosphates, silicates and borates of alkali metals; amines such as 2-diethylaminoethanol, monoethanolamine and diethanolamine; and quarternary ammonium salts such as tetramethylammonium hydroxide and choline. After the development, the developed film is preferably rinsed with water, and then may be dry-baked at a temperature of 50 to 140° C.

(v) Step of Curing Developed Substrate by Heating

Examples of the heating method include heating devices such as a hot plate and an oven. Heating is preferably carried out under the condition of a temperature of 120 to 250° C. and a heating time of 15 minutes to 2 hours.

A method of forming a cured film from the negative-type photosensitive resin composition of the present invention through undergoing the above five steps (i) to (v) is suitable as a production method of an OGS touch panel since the method is excellent in a pattern dimension and a pattern linearity, and the resulting cured film is suitable as a light-shielding pattern in a touch panel of an OGS type since it is excellent in a light-shielding property and a reflected color characteristic. An OD value of the light-shielding pattern is preferably 0.6 or more, and more preferably 0.7 or more since a wire formed above the light-shielding pattern can be shielded.

EXAMPLES

Hereinafter, the present invention will be described in more detail with reference to examples and comparative examples. Evaluation methods in each example and comparative example are as follows.

<Evaluation of Patternability>

The negative-type photosensitive coloring composition was applied onto an alkali-free glass substrate 10 cm square at an arbitrary rotating speed with a spin coater, and the substrate was pre-baked at 100° C. for 2 minutes with a hot plate (SCW-636 manufactured by Dainippon Screen Mfg. Co., Ltd.) to form a cured film having a thickness of 10 μm. Next, the formed film was exposed to light from an ultra-high pressure mercury lamp using a PLA (PLA-501F; manufactured by Canon Inc.) at an exposure amount of 200 mJ (i-ray) through a mask having a line & space of 150 μm, 100 μm and 80 μm in width with a gap of 150 μm. Thereafter, the exposed film was shower-developed with a 2.38% by mass aqueous solution of tetramethylammonium hydroxide (ELM-D; manufactured by MITSUBISHI GAS CHEMICAL CO., INC.) for 60 seconds using an automatic developing apparatus (manufactured by Takizawa Sangyo Co., Ltd.; AD-2000), and then rinsed with water for 30 seconds.

The pattern after development was observed with an optical microscope, and such narrowest line width that there is no residue in an unexposed portion was defined as the resolution. The case in which the residue remained in the unexposed portion of 150 μm in width was considered as ">150 μm".

Subsequently, the exposed substrate was cured in air at 230° C. for 30 minutes using an oven (IHPS-222; manufactured by Espec Corp.) to form a cured film. A cross-section of a pattern of a line & space of 150 μm in width of the resulting cured film was cut out and observed with use of a scanning electron microscope, and a pattern shape was evaluated according to the following criteria. However, when the resolution is larger than 150 μm (>150 μm), the pattern was not evaluated.

A: Taper angle less than 60°
B: Taper angle 60° or more and less than 90°
C: Taper angle 90° or more (undercut shape)

<Evaluation of Crack Resistance>

The negative-type photosensitive coloring composition was applied onto alkali-free glass substrates 10 cm square with a spin coater (1H-360S; manufactured by MIKASA CO., LTD.) so that thicknesses of cured films of the composition were respectively 5 μm, 10 μm, 15 μm and 20 μm, and each of the substrates was pre-baked at 100° C. for 2 minutes with a hot plate to form a cured film. Next, the whole surface of the formed film was exposed to light from an ultra-high pressure mercury lamp using a PLA at an exposure amount of 200 mJ (i-ray). Thereafter, the exposed film was shower-developed with a 2.38% by mass aqueous solution of tetramethylammonium hydroxide for 60 seconds using an automatic developing apparatus, and then rinsed with water for 30 seconds. Finally, the exposed film was cured in air at 230° C. for 1 hour using an oven (IHPS-222; manufactured by Espec Corp.) to obtain a cured film. The existence or non-existence of the occurrence of cracks of the resulting cured film was visually determined, and it is decided that the cured film does not have crack resistance at that film thickness if there is even one crack. For example, when there is not a crack at the film thickness of 15 μm and there is a crack at the film thickness of 20 μm, a crack-resistant film thickness was considered as ">15 μm". Moreover, a crack-resistant film thickness in the case in which there is not a crack even at the film thickness of 20 μm was considered as ">20 μm", and a crack-resistant film thickness in the case in which there is a crack even at the film thickness of 5 μm was considered as "<5 μm".

<Formation of Cured Film for Evaluation of Film Properties>

The negative-type photosensitive coloring composition was applied onto alkali-free glass substrates 10 cm square with a spin coater so that a thickness of each of cured films of the composition was 10 μm, and thereafter, cured films for evaluation of film properties were formed in the same manner as in Evaluation of Crack Resistance. In addition, when there is a crack in the cured film, film properties were not evaluated.

<Evaluation of Color Characteristics>

When the negative-type photosensitive coloring composition contains only a white pigment as a coloring agent, color characteristics were evaluated.

With respect to the cured films for evaluation of film properties, a reflection coefficient of total reflection light of a cured film after curing was measured from a glass substrate side using a spectrophotometer (UV-2450; manufactured by Shimadzu Corporation), and color characteristics were evaluated in a CIE 1976 (L*, a*, b*) color space. As a light source, a light source D65 was used.

<Evaluation of Change in Color>

When the negative-type photosensitive coloring composition contains only a white pigment as a coloring agent, change in color was evaluated. In addition, also when there is a crack in the cured film additionally heat treated, evaluation was not performed.

The cured films for evaluation of film properties were additionally heat treated in air at 240° C. for 2 hours using an oven (IHPS-222; manufactured by Espec Corp.). With respect to the cured films additionally heat treated, a reflection coefficient of total reflection light of a cured film after curing was measured from a glass substrate side using a spectrophotometer (UV-2450; manufactured by Shimadzu Corporation), values displayed in a CIE 1976 (L*, a*, b*) color space were compared with the above-mentioned evaluation results of color characteristics, and a color difference (hereinafter, "ΔEab") was calculated from the following equation (I).

$$\Delta Eab = (X1^2 + X2^2 + X3^2)^{0.5} \quad \text{Eq. (1)}$$

Here,
X1: {L*(0)}−{L*(1)}
X2: {a*(0)}−{a*(1)}
X3: {b*(0)}−{b*(1)},
L*(0), a*(0) and b*(0) indicate values of L*, a* and b* of the cured film for evaluation of film properties, and L*(1), a*(1) and b*(1) indicate values of L*, a* and b* of the cured film additional heat treated.

Herein, the case in which ΔEab was less than 1.0 was rated as "S", the case in which ΔEab was 1.0 or more and less than 1.5 was rated as "A", the case in which ΔEab was 1.5 or more and 2.5 or less was rated as "B", and the case in which ΔEab was more than 2.5 was rated as "C".

<Evaluation Adhesiveness>

The cured film for evaluation of film properties was cut at 1 mm intervals in vertical and lateral directions with a cutter knife to prepare 100 squares having a size of 1 mm×1 mm. Subsequently, a cellophane adhesive tape (width: 18 mm, adhesive force: 3.7 N/10 mm) was adhered to the square so as to cover all squares, and the tape was brought into contact with the squares by rubbing with an eraser (accepted product for JIS S 6050). Thereafter, the cellophane adhesive tape was held at one end in a direction perpendicular to the glass substrate, and after the tape was peeled at a moment, the number of remaining squares was checked to determine a proportion of peeled squares, i.e., a peeled area ratio. The peeled area ratio was classified into five ranks according to the following criteria.

5B: Peeled area=0%
4B: Peeled area=1 to 4%
3B: Peeled area=5 to 14%
2B: Peeled area=15 to 34%
1B: Peeled area=35 to 64%
0B: Peeled area=65 to 100%

<Preparation of Negative-Type Photosensitive Transparent Composition>

Into a 500 mL flask, 3 g of 2,2'-azobis(isobutyronitrile) and 50 g of propylene glycol methyl ether acetate were charged. Thereafter, 30 g of methacrylic acid, 22.48 g of styrene and 25.13 g of cyclohexyl methacrylate were charged, the resulting mixture was stirred at room temperature for some time, and the inside of the flask was replaced with nitrogen, and then the mixture was heated and stirred at 70° C. for 5 hours. Next, to the resulting solution, 15 g of glycidyl methacrylate, 1 g of dimethylbenzylamine, 0.2 g of p-methoxyphenol and 100 g of propylene glycol monomethyl ether acetate were added, and the resulting mixture was heated and stirred at 90° C. for 4 hours. To the resulting acrylic resin solution, propylene glycol monomethyl ether acetate was added so that a concentration of a solid content is 40% by mass to prepare an acrylic resin solution. A Mw of the obtained acrylic resin was 13500 and its acid number was 100 mgKOH/g.

A negative-type photosensitive transparent composition was prepared by mixing 50 g of the acrylic resin solution, 16 g of dipentaerythritol pentaacrylate (manufactured by Nippon Kayaku Co., Ltd.), 2 g of 1,2-octanedione, 1-[4-(phenylthio)-,2-(O-benzoyloxime)] ("IRGACURE" (registered trademark) OXE-01; manufactured by BASF CORPORATION), 31.9 g of diacetone alcohol and 0.1 g of polyether-modified polydimethylsiloxane (BYK-333; manufactured by BYK Japan KK).

<Formation of Cured Film with Transparent Protecting Film>

The negative-type photosensitive transparent composition was applied onto the surface of the cured film for evaluation of film properties with a spin coater so as to be 2 μm in film thickness after curing, and a substrate was pre-baked at 100° C. for 2 minutes with use of a hot plate to prepare a cured film having a thickness of 2 μm. Next, the whole surface of the formed film was exposed to light from an ultra-high pressure mercury lamp using a PLA at an exposure amount of 100 mJ (i-ray). Thereafter, the exposed film was shower-developed with a 2.38% by mass aqueous solution of tetramethylammonium hydroxide for 60 seconds using an automatic developing apparatus, and then rinsed with water for 30 seconds. Finally, the exposed film was cured in air at 230° C. for 30 minutes using an oven to form a transparent protecting film on the cured film for evaluation of film properties.

<Preparation of ITO Etchant for Evaluation of Chemical Resistance>

A mixture obtained by mixing 500 g of a 36% by mass aqueous solution of sodium chloride, 100 g of a 60% by mass nitric acid aqueous solution and 400 g of pure water is employed as an ITO etchant.

<Evaluation of Chemical Resistance>

Lines spaced 1 mm apart were inscribed on the cured film for evaluation of film properties and the cured film with a transparent protecting film with a cutter knife to prepare 100 squares having a size of 1 mm×1 mm.

Next, 200 g of the ITO etchant was put in a 500 cc glass beaker and adjusted so that an internal temperature was 50° C. by a water bath. In this beaker, the cured film provided with 100 squares was immersed for 2 minutes together with the glass substrate and further immersed in pure water prepared in another container for 30 seconds.

Moreover, 200 g of a resist-stripping solution (N-300; manufactured by Nagase ChemteX Corporation) was put in a glass beaker and adjusted so that an internal temperature was 70° C. by a water bath. In this beaker, the cured film treated with the ITO etchant was immersed for 4 minutes together with the glass substrate and further immersed in pure water prepared in another container for 30 seconds.

The cured film subjected to the above-mentioned treatment was evaluated in the same manner as in the above-mentioned "Evaluation of Adhesiveness".

Synthesis Example 1

Synthesis of Siloxane Resin Solution (b-1)

Into a 500 mL three-necked flask, 6.01 g (0.05 mole) of dimethoxydimethylsilane, 122.18 g (0.50 mole) of dimethoxydiphenylsilane, 46.86 g (0.20 mole) of 3-acryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane, 29.75 g (0.15 mole) of phenyltrimethoxysilane, and 156.52 g of propylene glycol monomethyl ether acetate were charged. To the resulting mixture, an aqueous phosphoric acid solution having 2.0 g of phosphoric acid dissolved in 54.0 g of water was added over 30 minutes while stirring the solution at room temperature. Thereafter, the flask was immersed in an oil bath of 40° C., the resulting mixture was stirred for 30 minutes, and then the oil bath was set at 70° C., heated for 30 minutes, and further the oil bath was heated up to 110° C. A reaction was completed after a lapse of three hours from the start of heating. A temperature of the solution was raised up to a temperature lower than the temperature setting of the oil bath by about 5° C. at this time. methanol produced during the reaction and water not consumed were removed by distillation. Propylene glycol monomethyl ether acetate was added to the resulting propylene glycol monomethyl ether acetate solution of polysiloxane so that a polymer concentration is 50% by mass to obtain a siloxane resin solution (b-1).

Synthesis Example 2

Synthesis of Siloxane Resin Solution (b-2)

A siloxane resin solution (b-2) was prepared in the same manner as in Synthesis Example 1 except for setting materials to be charged into the three-necked flask at the beginning to 18.03 g (0.15 mole) of dimethoxydimethylsilane, 97.74 g (0.40 mole) of dimethoxydiphenylsilane, 46.86 g (0.20 mole) of 3-acryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane, 29.75 g (0.15 mole) of phenyltrimethoxysilane and 145.06 g of propylene glycol monomethyl ether acetate.

Synthesis Example 3

Synthesis of Siloxane Resin Solution (b-3)

A siloxane resin solution (b-3) was prepared in the same manner as in Synthesis Example 1 except for setting materials to be charged into the three-necked flask at the beginning to 60.11 g (0.50 mole) of dimethoxydimethylsilane, 12.22 g (0.05 mole) of dimethoxydiphenylsilane, 46.86 g (0.20 mole) of 3-acryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane, 29.75 g (0.15 mole) of phenyltrimethoxysilane and 104.96 g of propylene glycol monomethyl ether acetate.

Synthesis Example 4

Synthesis of Siloxane Resin Solution (b-4)

A siloxane resin solution (b-4) was prepared in the same manner as in Synthesis Example 1 except for setting materials to be charged into the three-necked flask at the beginning to 48.09 g (0.40 mole) of dimethoxydimethylsilane, 36.65 g (0.15 mole) of dimethoxydiphenylsilane, 46.86 g (0.20 mole) of 3-acryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane, 29.75 g (0.15 mole) of phenyltrimethoxysilane and 116.42 g of propylene glycol monomethyl ether acetate.

Synthesis Example 5

Synthesis of Siloxane Resin Solution (b-5)

A siloxane resin solution (b-5) was prepared in the same manner as in Synthesis Example 1 except for setting materials to be charged into the three-necked flask at the beginning to 48.09 g (0.40 mole) of dimethoxydimethylsilane, 36.65 g (0.15 mole) of dimethoxydiphenylsilane, 49.67 g (0.20 mole) of 3-methacryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane, 29.75 g (0.15 mole) of phenyltrimethoxysilane and 119.01 g of propylene glycol monomethyl ether acetate.

Synthesis Example 6

Synthesis of Siloxane Resin Solution (b-6)

A siloxane resin solution (b-6) was prepared in the same manner as in Synthesis Example 1 except for setting materials to be charged into the three-necked flask at the beginning to 48.09 g (0.40 mole) of dimethoxydimethylsilane, 36.65 g (0.15 mole) of dimethoxydiphenylsilane, 46.86 g (0.20 mole) of 3-acryloxypropyltrimethoxysilane, 13.12 g (0.05 mole) of 3-trimethoxysilylpropylsuccinic anhydride, 13.92 g (0.05 mole) of 3-glycidyloxypropyltrimethoxysilane, 29.75 g (0.15 mole) of phenyltrimethoxysilane and 117.89 g of propylene glycol monomethyl ether acetate.

Synthesis Example 7

Synthesis of Siloxane Resin Solution (b-7)

A siloxane resin solution (b-7) was prepared in the same manner as in Synthesis Example 1 except for setting materials to be charged into the three-necked flask at the beginning to 36.07 g (0.30 mole) of dimethoxydimethylsilane, 85.53 g (0.35 mole) of dimethoxydiphenylsilane, 35.15 g (0.15 mole) of 3-acryloxypropyltrimethoxysilane, 13.12 g (0.05 mole) of 3-trimethoxysilylpropylsuccinic anhydride, 13.92 g (0.05 mole) of 3-glycidyloxypropyltrimethoxysilane, 19.83 g (0.10 mole) of phenyltrimethoxysilane and 131.94 g of propylene glycol monomethyl ether acetate.

Synthesis Example 8

Synthesis of Siloxane Resin Solution (b-8)

A siloxane resin solution (b-8) was prepared in the same manner as in Synthesis Example 1 except for setting materials to be charged into the three-necked flask at the beginning to 48.09 g (0.40 mole) of dimethoxydimethylsilane, 85.53 g (0.35 mole) of dimethoxydiphenylsilane, 35.15 g (0.15 mole) of 3-acryloxypropyltrimethoxysilane, 13.12 g (0.05 mole) of 3-trimethoxysilylpropylsuccinic anhydride, 13.92 g (0.05 mole) of 3-glycidyloxypropyltrimethoxysilane and 124.74 g of propylene glycol monomethyl ether acetate.

Synthesis Example 9

Synthesis of Siloxane Resin Solution (b-9)

A siloxane resin solution (b-9) was prepared in the same manner as in Synthesis Example 1 except for setting materials to be charged into the three-necked flask at the beginning to 48.09 g (0.40 mole) of dimethoxydimethylsilane, 85.53 g (0.35 mole) of dimethoxydiphenylsilane, 37.25 g (0.15 mole) of 3-methacryloxypropyltrimethoxysilane, 13.12 g (0.05 mole) of 3-trimethoxysilylpropylsuccinic anhydride, 13.92 g (0.05 mole) of 3-glycidyloxypropyltrimethoxysilane and 124.74 g of propylene glycol monomethyl ether acetate.

Synthesis Example 10

Synthesis of Siloxane Resin Solution (b-10)

A siloxane resin solution (b-10) was prepared in the same manner as in Synthesis Example 1 except for setting materials to be charged into the three-necked flask at the beginning to 48.87 g (0.20 mole) of dimethoxydiphenylsilane, 46.86 g (0.20 mole) of 3-acryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane, 99.15 g (0.50 mole) of phenyltrimethoxysilane and 147.37 g of propylene glycol monomethyl ether acetate.

Synthesis Example 11

Synthesis of Siloxane Resin Solution (b-11)

A siloxane resin solution (b-11) was prepared in the same manner as in Synthesis Example 1 except for setting materials to be charged into the three-necked flask at the beginning to 36.07 g (0.30 mole) of dimethoxydimethylsilane, 73.31 g (0.30 mole) of dimethoxydiphenylsilane, 46.86 g (0.20 mole) of 3-acryloxypropyltrimethoxysilane, 13.12 g (0.05 mole) of 3-trimethoxysilylpropylsuccinic anhydride, 13.92 g (0.05 mole) of 3-glycidyloxypropyltrimethoxysilane, 19.83 g (0.10 mole) of phenyltrimethoxysilane and 131.48 g of propylene glycol monomethyl ether acetate.

Synthesis Example 12

Synthesis of Siloxane Resin Solution (b-12)

A siloxane resin solution (b-12) was prepared in the same manner as in Synthesis Example 1 except for setting materials to be charged into the three-necked flask at the beginning to 36.07 g (0.30 mole) of dimethoxydimethylsilane, 85.53 g (0.35 mole) of dimethoxydiphenylsilane, 70.29 g (0.20 mole) of 3-acryloxypropyltrimethoxysilane, 13.12 g (0.05 mole) of 3-trimethoxysilylpropylsuccinic anhydride and 133.23 g of propylene glycol monomethyl ether acetate.

Synthesis Example 13

Synthesis of Siloxane Resin Solution (b-13)

A siloxane resin solution (b-13) was prepared in the same manner as in Synthesis Example 1 except for setting materials to be charged into the three-necked flask at the beginning to 36.07 g (0.30 mole) of dimethoxydimethylsilane, 73.31 g (0.30 mole) of dimethoxydiphenylsilane, 35.15 g (0.15 mole) of 3-acryloxypropyltrimethoxysilane, 13.12 g (0.05 mole) of 3-trimethoxysilylpropylsuccinic anhydride, 24.64 g (0.10 mole) of 3-(3,4-epoxycyclohexyl)propyltrimethoxysilane, 19.83 g (0.10 mole) of phenyltrimethoxysilane and 130.56 g of propylene glycol monomethyl ether acetate.

Synthesis Example 14

Synthesis of Siloxane Resin Solution (b-14)

A siloxane resin solution (b-14) was prepared in the same manner as in Synthesis Example 1 except for setting materials to be charged into the three-necked flask at the beginning to 36.07 g (0.30 mole) of dimethoxydimethylsilane, 73.31 g (0.30 mole) of dimethoxydiphenylsilane, 46.86 g (0.20 mole) of 3-acryloxypropyltrimethoxysilane, 13.12 g (0.05 mole) of 3-trimethoxysilylpropylsuccinic anhydride, 24.64 g (0.10 mole) of 3-(3,4-epoxycyclohexyl)propyltrimethoxysilane, 6.81 g (0.05 mole) of methyltrimethoxysilane and 129.36 g of propylene glycol monomethyl ether acetate.

Synthesis Example 15

Synthesis of Siloxane Resin Solution (b-15)

A siloxane resin solution (b-15) was prepared in the same manner as in Synthesis Example 1 except for setting materials to be charged into the three-necked flask at the beginning to 36.07 g (0.30 mole) of dimethoxydimethylsilane, 73.31 g (0.30 mole) of dimethoxydiphenylsilane, 46.86 g (0.20 mole) of 3-acryloxypropyltrimethoxysilane, 13.12 g (0.05 mole) of 3-trimethoxysilyipropylsuccinic anhydride, 24.64 g (0.10 mole) of 3-(3,4-epoxycyclohexyl)propyltrimethoxysilane, 10.42 g (0.05 mole) of tetraethoxysilane and 132.68 g of propylene glycol monomethyl ether acetate.

Synthesis Example 16

Synthesis of Siloxane Resin Solution (b-16)

A siloxane resin solution (b-16) was prepared in the same manner as in Synthesis Example 1 except for setting materials to be charged into the three-necked flask at the beginning to 36.07 g (0.30 mole) of dimethoxydimethylsilane, 73.31 g (0.30 mole) of dimethoxydiphenylsilane, 11.72 g (0.05 mole) of 3-acryloxypropyltrimethoxysilane, 13.12 g (0.05 mole) of 3-trimethoxysilylpropylsuccinic anhydride, 24.64 g (0.10 mole) of 3-(3,4-epoxycyclohexyl)propyltrimethoxysilane, 39.66 g (0.20 mole) of phenyltrimethoxysilane and 127.24 g of propylene glycol monomethyl ether acetate.

Synthesis Example 17

Synthesis of Siloxane Resin Solution (b-17)

A siloxane resin solution (b-17) was prepared in the same manner as in Synthesis Example 1 except for setting materials to be charged into the three-necked flask at the beginning to 12.02 g (0.10 mole) of dimethoxydimethylsilane, 73.31 g (0.30 mole) of dimethoxydiphenylsilane, 93.72 g (0.40 mole) of 3-acryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane, 19.83 g (0.10 mole) of phenyltrimethoxysilane and 151.06 g of propylene glycol monomethyl ether acetate.

Synthesis Example 18

Synthesis of Siloxane Resin Solution (b-18)

A siloxane resin solution (b-18) was prepared in the same manner as in Synthesis Example 1 except for setting materials to be charged into the three-necked flask at the beginning to 12.02 g (0.10 mole) of dimethoxydimethylsilane, 73.31 g (0.30 mole) of dimethoxydiphenylsilane, 117.15 g (0.50 mole) of 3-acryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane and 154.38 g of propylene glycol monomethyl ether acetate.

Synthesis Example 19

Synthesis of Siloxane Resin Solution (b-19)

A siloxane resin solution (b-19) was prepared in the same manner as in Synthesis Example 1 except for setting materials to be charged into the three-necked flask at the beginning to 24.04 g (0.20 mole) of dimethoxydimethylsilane, 97.74 g (0.40 mole) of dimethoxydiphenylsilane, 70.29 g (0.30 mole) of 3-acryloxypropyltrimethoxysilane, 13.12 g (0.05 mole) of 3-trimethoxysilylpropylsuccinic anhydride, 13.92 g (0.05 mole) of 3-glycidyloxypropyltrimethoxysilane and 146.26 g of propylene glycol monomethyl ether acetate.

Synthesis Example 20

Synthesis of Siloxane Resin Solution (b-20)

A siloxane resin solution (b-20) was prepared in the same manner as in Synthesis Example 1 except for setting materials to be charged into the three-necked flask at the beginning to 24.04 g (0.20 mole) of dimethoxydimethylsilane, 73.31 g (0.30 mole) of dimethoxydiphenylsilane, 70.29 g (0.30 mole) of 3-acryloxypropyltrimethoxysilane, 39.35 g (0.15 mole) of 3-trimethoxysilylpropylsuccinic anhydride, 13.92 g (0.05 mole) of 3-glycidyloxypropyltrimethoxysilane and 147.92 g of propylene glycol monomethyl ether acetate.

Synthesis Example 21

Synthesis of Siloxane Resin Solution (b-21)

A siloxane resin solution (b-21) was prepared in the same manner as in Synthesis Example 1 except for setting materials to be charged into the three-necked flask at the beginning to 24.04 g (0.20 mole) of dimethoxydimethylsilane, 73.31 g (0.30 mole) of dimethoxydiphenylsilane, 70.29 g (0.30 mole) of 3-acryloxypropyltrimethoxysilane, 13.12 g (0.05 mole) of 3-trimethoxysilylpropylsuccinic anhydride, 41.76 g (0.05 mole) of 3-glycidyloxypropyltrimethoxysilane and 149.40 g of propylene glycol monomethyl ether acetate.

Synthesis Example 22

Synthesis of Siloxane Resin Solution (b-22)

A siloxane resin solution (b-22) was prepared in the same manner as in Synthesis Example 1 except for setting materials to be charged into the three-necked flask at the beginning to 66.12 g (0.55 mole) of dimethoxydimethylsilane, 46.86 g (0.20 mole) of 3-acryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane, 29.75 g (0.15 mole) of phenyltrimethoxysilane and 99.23 g of propylene glycol monomethyl ether acetate.

Synthesis Example 23

Synthesis of Siloxane Resin Solution (b-23)

A siloxane resin solution (b-23) was prepared in the same manner as in Synthesis Example 1 except for setting materials to be charged into the three-necked flask at the beginning to 48.09 g (0.40 mole) of dimethoxydimethylsilane, 85.53 g (0.35 mole) of dimethoxydiphenylsilane, 34.85 g (0.15 mole) of 3-methacryloxypropylmethyldimethoxysilane, 13.12 g (0.05 mole) of 3-trimethoxysilylpropylsuccinic anhydride, 13.92 g (0.05 mole) of 3-glycidyloxypropyltrimethoxysilane and 124.74 g of propylene glycol monomethyl ether acetate.

Synthesis Example 24

Synthesis of Siloxane Resin Solution (b-24)

A siloxane resin solution (b-24) was prepared in the same manner as in Synthesis Example 1 except for setting materials to be charged into the three-necked flask at the beginning to 48.09 g (0.40 mole) of dimethoxydimethylsilane, 109.97 g (0.45 mole) of dimethoxydiphenylsilane, 24.83 g (0.15 mole) of 3-methacryloxypropylmethyldimethoxysilane, 13.12 g (0.05 mole) of 3-trimethoxysilylpropylsuccinic anhydride and 124.74 g of propylene glycol monomethyl ether acetate.

Synthesis Example 25

Synthesis of Siloxane Resin Solution (b-25)

A siloxane resin solution (b-25) was prepared in the same manner as in Synthesis Example 1 except for setting materials to be charged into the three-necked flask at the beginning to 48.09 g (0.40 mole) of dimethoxydimethylsilane, 85.53 g (0.35 mole) of dimethoxydiphenylsilane, 37.25 g (0.15 mole) of 3-methacryloxypropyltrimethoxysilane, 12.32 g (0.05 mole) of 3-dimethoxymethylsilylpropylsuccinic anhydride, 13.92 g (0.05 mole) of 3-glycidyloxypropyltrimethoxysilane and 124.74 g of propylene glycol monomethyl ether acetate.

Synthesis Example 26

Synthesis of Siloxane Resin Solution (b-26)

A siloxane resin solution (b-26) was prepared in the same manner as in Synthesis Example 1 except for setting materials to be charged into the three-necked flask at the beginning to 46.86 g (0.20 mole) of 3-acryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane, 138.81 g (0.70 mole) of phenyltrimethoxysilane and 138.87 g of propylene glycol monomethyl ether acetate.

Synthesis Example 27

Synthesis of Siloxane Resin Solution (b-27)

A siloxane resin solution (b-27) was prepared in the same manner as in Synthesis Example 1 except for setting materials to be charged into the three-necked flask at the beginning to 74.51 g (0.30 mole) of 3-methacryloxypropyltrimethoxysilane, 13.12 g (0.05 mole) of 3-trimethoxysilylpropylsuccinic anhydride, 12.32 g (0.05 mole) of 3-(3,4-epoxycyclohexyl)propyltrimethoxysilane, 27.24 g (0.20 mole) of methyltrimethoxysilane, 79.32 g (0.40 mole) of phenyltrimethoxysilane and 134.62 g of propylene glycol monomethyl ether acetate.

Synthesis Example 28

Synthesis of Siloxane Resin Solution (b-28)

A siloxane resin solution (b-28) was prepared in the same manner as in Synthesis Example 1 except for setting materials to be charged into the three-necked flask at the beginning to 36.07 g (0.30 mole) of dimethoxydimethylsilane, 73.31 g (0.30 mole) of dimethoxydiphenylsilane, 70.29 g (0.30 mole) of 3-acryloxypropyltrimethoxysilane, 27.84 g (0.10 mole) of 3-glycidyloxypropyltrimethoxysilane and 135.54 g of propylene glycol monomethyl ether acetate.

Synthesis Example 29

Synthesis of Siloxane Resin Solution (b-29)

A siloxane resin solution (b-29) was prepared in the same manner as in Synthesis Example 1 except for setting materials to be charged into the three-necked flask at the beginning to 30.06 g (0.25 mole) of dimethoxydimethylsilane, 97.74 g (0.40 mole) of dimethoxydiphenylsilane, 13.12 g (0.05 mole) of 3-trimethoxysilylpropylsuccinic anhydride, 12.32 g (0.05 mole) of 3-(3,4-epoxycyclohexyl)propyltrimethoxysilane, 49.58 g (0.25 mole) of phenyltrimethoxysilane and 131.21 g of propylene glycol monomethyl ether acetate.

Synthesis Example 30

Synthesis of Mixed Solution (g-1) of Silane Coupling Agent

To 200 g of PGMEA, 41.97 g (0.160 mole) of 3-trimethoxysilylpropylsuccinic anhydride and 11.70 g (0.160 mole) of t-butylamine were added, the resulting mixture was stirred at room temperature for some time and then stirred at 40° C. for 2 hours. Thereafter, the mixture was heated up to 80° C. and reacted for 6 hours. The resulting solution was diluted with PGMEA so that its solid content concentration was 20% by mass to obtain a mixed solution (g-1) of 3-(tert-butylcarbamoyl)-6-(trimethoxysilyl) hexanoic acid and 2-[2-(tert-butylamino)-2-oxoethyl]-5-(trimethoxysilyl)pentanoic acid.

Example 1

After 13.00 g of white pigment, namely, a titanium dioxide pigment (CR-97; manufactured by ISHIHARA SANGYO KAISHA, LTD.), 26.00 g of the siloxane resin solution (b-1) and 1.00 g of propylene glycol monomethyl ether were mixed, the resulting mixture was dispersed with use of a mill-type disperser loaded with zirconia beads to obtain a pigment dispersion (MW-1).

Then, 28.21 g of the pigment dispersion (MW-1), 5.24 g of the siloxane resin solution (b-1), 5.24 g of a mixture of ethoxylated isocyanurate diacrylate and ethoxylated isocyanurate triacrylate (ARONIX M-315; manufactured by TOAGOSEI CO., LTD.), 0.79 g of bis(2,4,6-trimethylbenzoyl)phenylphosphine oxide (IRGACURE 819; manufactured by BASF CORPORATION), 0.52 g of pentaerythritol tetrakis(3-mercaptobutyrate) (Karenz MT-PE1; manufactured by Showa Denko K.K.) and 10.01 g of propylene glycol monomethyl ether were stirred/mixed to form a negative-type photosensitive coloring composition (W-1). Using this composition, patternability, crack resistance and various film properties were evaluated.

Example 2

A pigment dispersion (MW-2) and a negative-type photosensitive coloring composition (W-2) were obtained in the same manner as in Example 1 except for using the siloxane resin solution (b-2) in place of the siloxane resin solution (b-1). Using this composition, patternability, crack resistance and various film properties were evaluated.

Example 3

A pigment dispersion (MW-3) and a negative-type photosensitive coloring composition (W-3) were obtained in the same manner as in Example 1 except for using the siloxane resin solution (b-3) in place of the siloxane resin solution (b-1). Using this composition, patternability, crack resistance and various film properties were evaluated.

Example 4

A pigment dispersion (MW-4) and a negative-type photosensitive coloring composition (W-4) were obtained in the same manner as in Example 1 except for using the siloxane resin solution (b-4) in place of the siloxane resin solution (b-1). Using this composition, patternability, crack resistance and various film properties were evaluated.

Example 5

A pigment dispersion (MW-5) and a negative-type photosensitive coloring composition (W-5) were obtained in the same manner as in Example 1 except for using the siloxane resin solution (b-5) in place of the siloxane resin solution (b-1). Using this composition, patternability, crack resistance and various film properties were evaluated.

Example 6

A pigment dispersion (MW-6) and a negative-type photosensitive coloring composition (W-6) were obtained in the same manner as in Example 1 except for using the siloxane resin solution (b-6) in place of the siloxane resin solution (b-1). Using this composition, patternability, crack resistance and various film properties were evaluated.

Example 7

A pigment dispersion (MW-7) and a negative-type photosensitive coloring composition (W-7) were obtained in the same manner as in Example 1 except for using the siloxane resin solution (b-7) in place of the siloxane resin solution (b-1). Using this composition, patternability, crack resistance and various film properties were evaluated.

Example 8

A pigment dispersion (MW-8) and a negative-type photosensitive coloring composition (W-8) were obtained in the same manner as in Example 1 except for using the siloxane resin solution (b-8) in place of the siloxane resin solution (b-1). Using this composition, patternability, crack resistance and various film properties were evaluated.

Example 9

A pigment dispersion (MW-9) and a negative-type photosensitive coloring composition (W-9) were obtained in the same manner as in Example 1 except for using the siloxane resin solution (b-9) in place of the siloxane resin solution (b-1). Using this composition, patternability, crack resistance and various film properties were evaluated.

Example 10

A pigment dispersion (MW-10) and a negative-type photosensitive coloring composition (W-10) were obtained in the same manner as in Example 1 except for using the siloxane resin solution (b-11) in place of the siloxane resin solution (b-1). Using this composition, patternability, crack resistance and various film properties were evaluated.

Example 11

A negative-type photosensitive coloring composition (W-11) was obtained in the same manner as in Example 10 except for not adding pentaerythritol tetrakis(3-mercaptobutyrate) (Karenz MT-PE1; manufactured by Showa Denko K.K.). Using this composition, patternability, crack resistance and various film properties were evaluated.

Example 12

A pigment dispersion (MW-12) and a negative-type photosensitive coloring composition (W-12) were obtained in the same manner as in Example 1 except for using the siloxane resin solution (b-12) in place of the siloxane resin solution (b-1). Using this composition, patternability, crack resistance and various film properties were evaluated.

Example 13

A pigment dispersion (MW-13) and a negative-type photosensitive coloring composition (W-13) were obtained in the same manner as in Example 1 except for using the siloxane resin solution (b-13) in place of the siloxane resin solution (b-1). Using this composition, patternability, crack resistance and various film properties were evaluated.

Example 14

A pigment dispersion (MW-14) and a negative-type photosensitive coloring composition (W-14) were obtained in the same manner as in Example 1 except for using the siloxane resin solution (b-14) in place of the siloxane resin solution (b-1). Using this composition, patternability, crack resistance and various film properties were evaluated.

Example 15

A pigment dispersion (MW-15) and a negative-type photosensitive coloring composition (W-15) were obtained in the same manner as in Example 1 except for using the siloxane resin solution (b-15) in place of the siloxane resin solution (b-1). Using this composition, patternability, crack resistance and various film properties were evaluated.

Example 16

A pigment dispersion (MW-16) and a negative-type photosensitive coloring composition (W-16) were obtained in the same manner as in Example 1 except for using the siloxane resin solution (b-16) in place of the siloxane resin solution (b-1). Using this composition, patternability, crack resistance and various film properties were evaluated.

Example 17

A pigment dispersion (MW-17) and a negative-type photosensitive coloring composition (W-17) were obtained in the same manner as in Example 1 except for using the siloxane resin solution (b-17) in place of the siloxane resin solution (b-1). Using this composition, patternability, crack resistance and various film properties were evaluated.

Example 18

A pigment dispersion (MW-18) and a negative-type photosensitive coloring composition (W-18) were obtained in the same manner as in Example 1 except for using the siloxane resin solution (b-18) in place of the siloxane resin solution (b-1). Using this composition, patternability, crack resistance and various film properties were evaluated.

Example 19

A pigment dispersion (MW-19) and a negative-type photosensitive coloring composition (W-19) were obtained in the same manner as in Example 1 except for using the siloxane resin solution (b-19) in place of the siloxane resin solution (b-1). Using this composition, patternability, crack resistance and various film properties were evaluated.

Example 20

A pigment dispersion (MW-20) and a negative-type photosensitive coloring composition (W-20) were obtained in the same manner as in Example 1 except for using the siloxane resin solution (b-20) in place of the siloxane resin solution (b-1). Using this composition, patternability, crack resistance and various film properties were evaluated.

Example 21

A pigment dispersion (MW-21) and a negative-type photosensitive coloring composition (W-21) were obtained in the same manner as in Example 1 except for using the siloxane resin solution (b-21) in place of the siloxane resin solution (b-1). Using this composition, patternability, crack resistance and various film properties were evaluated.

Example 22

A pigment dispersion (MW-22) and a negative-type photosensitive coloring composition (W-22) were obtained in the same manner as in Example 1 except for using the siloxane resin solution (b-23) in place of the siloxane resin solution (b-1). Using this composition, patternability, crack resistance and various film properties were evaluated.

Example 23

A pigment dispersion (MW-23) and a negative-type photosensitive coloring composition (W-23) were obtained in the same manner as in Example 1 except for using the siloxane resin solution (b-24) in place of the siloxane resin solution (b-1). Using this composition, patternability, crack resistance and various film properties were evaluated.

Example 24

A pigment dispersion (MW-24) and a negative-type photosensitive coloring composition (W-24) were obtained in the same manner as in Example 1 except for using the siloxane resin solution (b-25) in place of the siloxane resin solution (b-1). Using this composition, patternability, crack resistance and various film properties were evaluated.

Example 25

A negative-type photosensitive coloring composition (W-25) was obtained in the same manner as in Example 10 except for using 5.24 g of a mixture of dipentaerythritol pentaacrylate and dipentaerythritol hexaacrylate (KAYARAD DPHA; manufactured by Nippon Kayaku Co., Ltd.) in place of 5.24 g of the mixture of ethoxylated isocyanurate diacrylate and ethoxylated isocyanurate triacrylate (ARONIX M-315; manufactured by TOAGOSEI CO., LTD.). Using this composition, patternability, crack resistance and various film properties were evaluated.

Example 26

A pigment dispersion (MW-26) and a negative-type photosensitive coloring composition (W-26) were obtained in the same manner as in Example 10 except for using 13.00 g of a titanium dioxide pigment (JR-301; manufactured by Tayca Corporation) in place of 13.00 g of the titanium dioxide pigment (CR-97; manufactured by ISHIHARA SANGYO KAISHA, LTD.). Using this composition, patternability, crack resistance and various film properties were evaluated.

Example 27

A pigment dispersion (MW-27) and a negative-type photosensitive coloring composition (W-27) were obtained in the same manner as in Example 10 except for using 13.00 g of a titanium dioxide pigment (JR-405; manufactured by Tayca Corporation) in place of 13.00 g of the titanium dioxide pigment (CR-97; manufactured by ISHIHARA SANGYO KAISHA, LTD.). Using this composition, patternability, crack resistance and various film properties were evaluated.

Example 28

A pigment dispersion (MW-28) and a negative-type photosensitive coloring composition (W-28) were obtained in the same manner as in Example 10 except for using 13.00 g of a titanium dioxide pigment (JR-600A; manufactured by Tayca Corporation) in place of 13.00 g of the titanium dioxide pigment (CR-97; manufactured by ISHIHARA SANGYO KAISHA, LTD.). Using this composition, patternability, crack resistance and various film properties were evaluated.

Example 29

A pigment dispersion (MW-29) and a negative-type photosensitive coloring composition (W-29) were obtained in the same manner as in Example 10 except for using 13.00 g of a titanium dioxide pigment (JR-603; manufactured by Tayca Corporation) in place of 13.00 g of the titanium dioxide pigment (CR-97; manufactured by ISHIHARA SANGYO KAISHA, LTD.). Using this composition, patternability, crack resistance and various film properties were evaluated.

Example 30

A pigment dispersion (MW-30) and a negative-type photosensitive coloring composition (W-30) were obtained in the same manner as in Example 10 except for using 13.00 g of a titanium dioxide pigment (R960; manufactured by Du Pont Co.) in place of 13.00 g of the titanium dioxide pigment (CR-97; manufactured by ISHIHARA SANGYO KAISHA, LTD.). Using this composition, patternability, crack resistance and various film properties were evaluated.

Example 31

A negative-type photosensitive coloring composition (W-31) was obtained in the same manner as in Example 10 except for using 0.79 g of 2-methyl-1-(4-methylthiophenyl)-2-morpholinopropan-1-one (IRGACURE 907; manufactured by BASF CORPORATION) in place of 0.79 g of bis(2,4,6-trimethylbenzoyl)phenylphosphine oxide (IRGACURE 819; manufactured by BASF CORPORATION). Using this composition, patternability, crack resistance and various film properties were evaluated.

Example 32

A pigment dispersion (MW-32) was obtained in the same manner as in Example 1 except for using the siloxane resin solution (b-10) in place of the siloxane resin solution (b-1). Then, 20.15 g of the pigment dispersion (MW-32), 15.71 g of the siloxane resin solution (b-10), 5.24 g of the mixture of ethoxylated isocyanurate diacrylate and ethoxylated isocyanurate triacrylate (ARONIX M-315; manufactured by TOAGOSEI CO., LTD.), 0.79 g of bis(2,4,6-trimethylbenzoyl)phenylphosphine oxide (IRGACURE 819; manufactured by BASF CORPORATION), 0.52 g of pentaerythritol tetrakis(3-mercaptobutyrate) (Karenz MT-PE1; manufactured by Showa Denko K.K.) and 7.59 g of propylene glycol monomethyl ether were stirred/mixed to form a negative-type photosensitive coloring composition (W-32). Using this composition, patternability, crack resistance and various film properties were evaluated.

Example 33

A pigment dispersion (MW-33) and a negative-type photosensitive coloring composition (W-33) were obtained in the same manner as in Example 32 except for using the siloxane resin solution (b-11) in place of the siloxane resin solution (b-10). Using this composition, patternability, crack resistance and various film properties were evaluated.

Example 34

A pigment dispersion (MW-34) and a negative-type photosensitive coloring composition (W-34) were obtained in the same manner as in Example 32 except for using the siloxane resin solution (b-22) in place of the siloxane resin solution (b-10). Using this composition, patternability, crack resistance and various film properties were evaluated.

Example 35

A pigment dispersion (MW-10) was obtained in the same manner as in Example 1 except for using the siloxane resin solution (b-11) in place of the siloxane resin solution (b-1). Then, 32.23 g of the pigment dispersion (MW-10), 5.24 g of the mixture of ethoxylated isocyanurate diacrylate and ethoxylated isocyanurate triacrylate (ARONIX M-315; manufactured by TOAGOSEI CO., LTD.), 0.79 g of bis(2, 4,6-trimethylbenzoyl)phenylphosphine oxide (IRGACURE 819; manufactured by BASF CORPORATION), 0.52 g of pentaerythritol tetrakis(3-mercaptobutyrate) (Karenz MT-PE1; manufactured by Showa Denko K.K.) and 11.22 g of propylene glycol monomethyl ether were stirred/mixed to form a negative-type photosensitive coloring composition (W-35). Using this composition, patternability, crack resistance and various film properties were evaluated.

Example 36

A pigment dispersion (MW-10) was obtained in the same manner as in Example 1 except for using the siloxane resin solution (b-11) in place of the siloxane resin solution (b-1).
Then, 27.17 g of the pigment dispersion (MW-10), 5.05 g of the siloxane resin solution (b-11), 5.05 g of ARONIX M-315, 0.50 g of IRGACURE 819, 0.75 g of Karenz MT-PE1, 1.00 g of 3',4'-epoxycyclohexylmethyl 3,4-epoxycyclohexane carboxylate (CELLOXIDE 2021P; manufactured by DAICEL CORPORATION) and 10.45 g of propylene glycol monomethyl ether were stirred/mixed to form a negative-type photosensitive coloring composition (W-36). Using this composition, patternability, crack resistance and various film properties were evaluated.

Example 37

A pigment dispersion (MW-10) was obtained in the same manner as in Example 1 except for using the siloxane resin solution (b-11) in place of the siloxane resin solution (b-1).
Then, 27.94 g of the pigment dispersion (MW-10), 5.19 g of the siloxane resin solution (b-11), 5.19 g of ARONIX M-315, 0.52 g of IRGACURE 819, 0.77 g of Karenz MT-PE1, 1.29 g of the mixed solution (g-1) of a silane coupling agent and 9.09 g of propylene glycol monomethyl ether were stirred/mixed to form a negative-type photosensitive coloring composition (W-37). Using this composition, patternability, crack resistance and various film properties were evaluated.

Example 38

A pigment dispersion (MW-10) was obtained in the same manner as in Example 1 except for using the siloxane resin solution (b-11) in place of the siloxane resin solution (b-1).
Then, 28.07 g of the pigment dispersion (MW-10), 5.21 g of the siloxane resin solution (b-11), 5.21 g of ARONIX M-315, 0.52 g of IRGACURE 819, 0.78 g of Karenz MT-PE1, 0.13 g of 2-[2-hydroxy-4-[3-(2-ethylhexyl-1-oxy)-2-hydroxypropyloxy]phenyl]-4,6-bis(2,4-dimethylphenyl)-1,3,5-triazine (TINUVIN 405; manufactured by BASF CORPORATION) and 10.06 g of propylene glycol monomethyl ether were stirred/mixed to form a negative-type photosensitive coloring composition (W-38). Using this composition, patternability, crack resistance and various film properties were evaluated.

Example 39

A pigment dispersion (MW-10) was obtained in the same manner as in Example 1 except for using the siloxane resin solution (b-11) in place of the siloxane resin solution (b-1).
Then, 28.14 g of the pigment dispersion (MW-10), 5.22 g of the siloxane resin solution (b-11), 5.22 g of ARONIX M-315, 0.52 g of IRGACURE 819, 0.78 g of Karenz MT-PE1, 0.07 g of tetrakis(2,2,6,6-tetramethyl-4-pyridyl) butane-1,2,3,4-tetra carboxylate (ADK STAB LA-57; manufactured by ADEKA CORPORATION) and 10.06 g of propylene glycol monomethyl ether were stirred/mixed to form a negative-type photosensitive coloring composition (W-39). Using this composition, patternability, crack resistance and various film properties were evaluated.

Example 40

A pigment dispersion (MW-10) was obtained in the same manner as in Example 1 except for using the siloxane resin solution (b-11) in place of the siloxane resin solution (b-1).
Then, 26.74 g of the pigment dispersion (MW-10), 4.97 g of the siloxane resin solution (b-11), 4.97 g of ARONIX M-315, 0.50 g of IRGACURE 819, 0.74 g of Karenz MT-PE1, 0.06 g of ADK STAB LA-57, 0.12 g of TINUVIN 405, 0.99 g of CELLOXIDE 2021P, 1.24 g of the mixed solution (g-1) of a silane coupling agent and 9.66 g of propylene glycol monomethyl ether were stirred/mixed to form a negative-type photosensitive coloring composition (W-40). Using this composition, patternability, crack resistance and various film properties were evaluated.

Example 41

A pigment dispersion (MG-1) and a negative-type photosensitive coloring composition (G-1) were obtained in the same manner as in Example 10 except for using 13.74 g of the titanium dioxide pigment (CR-97; manufactured by ISHIHARA SANGYO KAISHA, LTD.) and 0.26 g of titanium nitride particles (Bk-1; manufactured by NISSHIN ENGINEERING INC.) in place of 13.00 g of the titanium dioxide pigment (CR-97; manufactured by ISHIHARA SANGYO KAISHA, LTD.). Using this composition, patternability, crack resistance and various film properties were evaluated. However, since the resulting coating is gray, its color characteristics were not evaluated.

Example 42

Preparation of Touch Panel Substrate

A touch panel substrate was prepared according to the following procedure.
(1) Preparation of White Light-Shielding Pattern
The negative-type photosensitive white composition (W-1) obtained in Preparation Example 1 was applied onto a tempered glass having a size of 10 cm×10 cm and a thickness of 0.7 mm with a spin coater so as to be 15 µm in film thickness after curing, and a substrate was pre-baked at 100° C. for 3 minutes with use of a hot plate. Next, the formed film was exposed to light from an ultra-high pressure mercury lamp using a PLA at an exposure amount of 200 mJ (i-ray) through a mask having a light-shielding pattern for a touch panel with a gap of 150 µm. Thereafter, the exposed film was shower-developed with a 2.38% by mass TMAH aqueous solution for 120 seconds using an automatic developing apparatus, and then rinsed with water for 30 seconds. Finally, the substrate was cured in air at 230° C. for 30 minutes using an oven to prepare a glass substrate with a white light-shielding pattern (corresponding to FIG. 1a).
(2) Formation of Patterned ITO
On the glass substrate prepared in the above (1), ITO having a thickness of 150 nm was deposited by performing sputtering at an RF power of 1.4 kW and a vacuum degree of $6.65 \times 10^{-1}$ Pa for 12.5 minutes using a sputtering system (HSR-521A; manufactured by Shimadzu Corporation), and a positive type photoresist ("OFPR-800" manufactured by Tokyo Ohka Kogyo Co., Ltd.) was applied onto the ITO film and pre-baked at 80° C. for 20 minutes to obtain a resist film having a thickness of 1.1 μm. After the obtained film was pattern-exposed to light from an ultra-high pressure mercury lamp using a PLA through a mask, the exposed film was shower-developed with a 2.38% by mass TMAH aqueous solution for 90 seconds using an automatic developing apparatus, and then rinsed with water for 30 seconds. Thereafter, ITO was etched by immersion into a 3.5% by mass aqueous solution of oxalic acid for 150 seconds, and the photoresist was removed by treatment with a stripping solution ("N-321" manufactured by Nagase ChemteX Corporation) at 50° C. for 120 seconds, and annealing was applied at 230° C. for 30 minutes to prepare a glass substrate having patterned ITO (symbol 3 in FIG. 1) with a thickness of 150 nm (corresponding to FIG. 1*b*).

(3) Formation of Transparent Insulating Film

On the glass substrate obtained in the above (2), transparent insulating films (symbol 4 in FIG. 1) were prepared (corresponding to FIG. 1*c*) in the same manner as in (1) except for using the negative-type photosensitive transparent composition (Cr-1) obtained in Preparation Example 50 to form a film thickness of 2 μm and performing exposure through a patterned mask.

(4) Formation of MAM Wire

Figure 2:
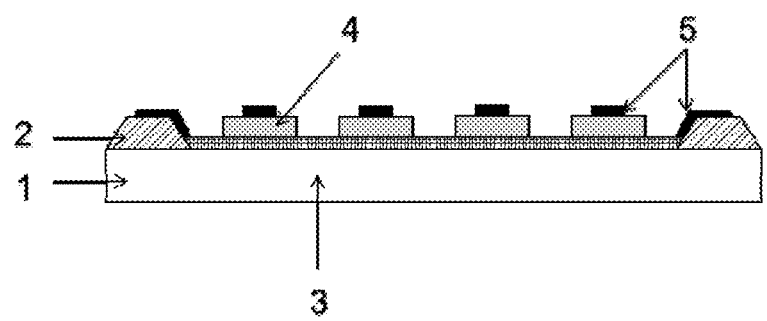
FIG. 2 is a schematic view showing a cross-section of a touch panel substrate prepared in Example 42 of the present invention.

On the glass substrate obtained in the above (3), MAM wires (symbol 5 in FIG. 1) with a thickness of 250 nm were prepared (corresponding to FIG. 1*d*) in the same manner as in (1) except for using molybdenum and aluminum as a target and a mixed solution of $H_3PO_4/HNO_3/CH_3COOH/H_2O$ (in a mass ratio of 65/3/5/27) as an etchant to complete a touch panel substrate (FIG. 1*d* and FIG. 2).

The continuity test of the resulting touch panel substrate was performed.

Comparative Example 1

A pigment dispersion (MWH-1) and a negative-type photosensitive coloring composition (WH-1) were obtained in the same manner as in Example 32 except for using the siloxane resin solution (b-26) in place of the siloxane resin solution (b-10). Using this composition, patternability and crack resistance were evaluated. In this case, since cracks were produced in the cured film having a thickness of 10 μm, various film properties were not evaluated.

Comparative Example 2

A pigment dispersion (MWH-2) and a negative-type photosensitive coloring composition (WH-2) were obtained in the same manner as in Example 32 except for using the siloxane resin solution (b-27) in place of the siloxane resin solution (b-10). Using this composition, patternability and crack resistance were evaluated. In this case, since cracks were produced in the cured film having a thickness of 10 μm, various film properties were not evaluated.

Comparative Example 3

A pigment dispersion (MWH-3) and a negative-type photosensitive coloring composition (WH-3) were obtained in the same manner as in Example 1 except for using the siloxane resin solution (b-28) in place of the siloxane resin solution (b-1). Using this composition, patternability, crack resistance and various film properties were evaluated.

Comparative Example 4

A pigment dispersion (MWH-4) and a negative-type photosensitive coloring composition (WH-4) were obtained in the same manner as in Example 1 except for using the siloxane resin solution (b-29) in place of the siloxane resin solution (b-1). Using this composition, patternability, crack resistance and various film properties were evaluated.

Comparative Example 5

A negative-type photosensitive coloring composition (WH-5) was obtained in the same manner as in Comparative Example 4 except for using 0.79 g of 2-methyl-1-(4-methylthiophenyl)-2-morpholinopropan-1-one (IRGACURE 907; manufactured by BASF CORPORATION) in place of 0.79 g of bis(2,4,6-trimethylbenzoyl)phenylphosphine oxide (IRGACURE 819; manufactured by BASF CORPORATION). Using this composition, patternability, crack resistance and various film properties were evaluated.

Composition of the alkoxysilane compounds used in Examples and Comparative Examples in synthesizing the siloxane resin solutions (b-1) to (b-29) are shown in Table 1. Further, composition ratios of Examples and Comparative Examples are shown in Table 2 and Table 3, and evaluation results are shown in Table 4.

TABLE 1

| | | (B) Polysiloxane Component | | | | | | | | |
|---|---|---|---|---|---|---|---|---|---|---|
| | | General Formula (1) | | General Formula (2) | | General Formula (3) | General Formula (5) | | Others | |
| | Name | Dimethyl | Diphenyl | Acryloyl | Methacryloyl | Succinic anhydride | Epoxy cyclohexyl | Glycigyloxy | Methyl | Phenyl | Tetra Ethoxy |
| Synthesis Example 1 | b-1 | 5 | 50 | 20 | — | 5 | 5 | — | — | 15 | — |
| Synthesis Example 2 | b-2 | 15 | 40 | 20 | — | 5 | 5 | — | — | 15 | — |
| Synthesis Example 3 | b-3 | 50 | 5 | 20 | — | 5 | 5 | — | — | 15 | — |
| Synthesis Example 4 | b-4 | 40 | 15 | 20 | — | 5 | 5 | — | — | 15 | — |
| Synthesis Example 5 | b-5 | 40 | 15 | — | 20 | 5 | 5 | — | — | 15 | — |
| Synthesis Example 6 | b-6 | 40 | 15 | 20 | — | 5 | — | 5 | — | 15 | — |

TABLE 1-continued

| | | (B) Polysiloxane Component | | | | | | | | | |
|---|---|---|---|---|---|---|---|---|---|---|---|
| | | General Formula (1) | | General Formula (2) | | General Formula (3) Succinic | General Formula (5) | | Others | | |
| | Name | Dimethyl | Diphenyl | Acryloyl | Methacryloyl | anhydride | Epoxy cyclohexyl | Glycigyloxy | Methyl | Phenyl | Tetra Ethoxy |
| Synthesis Example 7 | b-7 | 30 | 35 | 15 | — | 5 | — | 5 | — | 10 | — |
| Synthesis Example 8 | b-8 | 40 | 35 | 15 | — | 5 | — | 5 | — | — | — |
| Synthesis Example 9 | b-9 | 40 | 35 | — | 15 | 5 | — | 5 | — | — | — |
| Synthesis Example 10 | b-10 | — | 20 | 20 | — | 5 | 5 | — | — | 50 | — |
| Synthesis Example 11 | b-11 | 30 | 30 | 20 | — | 5 | — | 5 | — | 10 | — |
| Synthesis Example 12 | b-12 | 30 | 35 | 30 | — | 5 | — | — | — | — | — |
| Synthesis Example 13 | b-13 | 30 | 30 | 15 | — | 5 | 10 | — | — | 10 | — |
| Synthesis Example 14 | b-14 | 30 | 30 | 20 | — | 5 | 10 | — | 5 | — | — |
| Synthesis Example 15 | b-15 | 30 | 30 | 20 | — | 5 | 10 | — | — | — | 5 |
| Synthesis Example 16 | b-16 | 30 | 30 | 5 | — | 5 | 10 | — | — | 20 | — |
| Synthesis Example 17 | b-17 | 10 | 30 | 40 | — | 5 | 5 | — | — | 10 | — |
| Synthesis Example 18 | b-18 | 10 | 30 | 50 | — | 5 | 5 | — | — | — | — |
| Synthesis Example 19 | b-19 | 20 | 40 | 30 | — | 5 | — | 5 | — | — | — |
| Synthesis Example 20 | b-20 | 20 | 30 | 30 | — | 15 | — | 5 | — | — | — |
| Synthesis Example 21 | b-21 | 20 | 30 | 30 | — | 5 | — | 15 | — | — | — |
| Synthesis Example 22 | b-22 | 55 | — | 20 | — | 5 | 5 | — | — | 15 | — |
| Synthesis Example 23 | b-23 | 40 | 35 | — | 15 | 5 | — | 5 | — | — | — |
| Synthesis Example 24 | b-24 | 40 | 45 | — | 10 | 5 | — | — | — | — | — |
| Synthesis Example 25 | b-25 | 40 | 35 | — | 15 | 5 | — | 5 | — | — | — |
| Synthesis Example 26 | b-26 | — | — | 20 | — | 5 | 5 | — | — | 70 | — |
| Synthesis Example 27 | b-27 | — | — | — | 30 | 5 | 5 | — | 20 | 40 | — |
| Synthesis Example 28 | b-28 | 30 | 30 | 30 | — | — | — | 10 | — | — | — |
| Synthesis Example 29 | b-29 | 25 | 40 | — | — | 5 | 5 | — | — | 25 | — |

TABLE 2

| | | Component | | | | | | | | | |
|---|---|---|---|---|---|---|---|---|---|---|---|
| | | (A) | | (B) | | (C) | | (D) | | (F) | |
| | Name | Compound | Parts by Weight | Compound | Parts by Weight | Compound | Parts by Weight | Compound | Parts by Weight | Compound | Parts by Weight | (E) |
| Example 1 | W-1 | CR-97 | 35 | b-1 | 45 | IC-819 | 3 | M-315 | 20 | MT-PE1 | 2 | PGMEA |
| Example 2 | W-2 | CR-97 | 35 | b-2 | 45 | IC-819 | 3 | M-315 | 20 | MT-PE1 | 2 | PGMEA |
| Example 3 | W-3 | CR-97 | 35 | b-3 | 45 | IC-819 | 3 | M-315 | 20 | MT-PE1 | 2 | PGMEA |
| Example 4 | W-4 | CR-97 | 35 | b-4 | 45 | IC-819 | 3 | M-315 | 20 | MT-PE1 | 2 | PGMEA |
| Example 5 | W-5 | CR-97 | 35 | b-5 | 45 | IC-819 | 3 | M-315 | 20 | MT-PE1 | 2 | PGMEA |
| Example 6 | W-6 | CR-97 | 35 | b-6 | 45 | IC-819 | 3 | M-315 | 20 | MT-PE1 | 2 | PGMEA |
| Example 7 | W-7 | CR-97 | 35 | b-7 | 45 | IC-819 | 3 | M-315 | 20 | MT-PE1 | 2 | PGMEA |
| Example 8 | W-8 | CR-97 | 35 | b-8 | 45 | IC-819 | 3 | M-315 | 20 | MT-PE1 | 2 | PGMEA |
| Example 9 | W-9 | CR-97 | 35 | b-9 | 45 | IC-819 | 3 | M-315 | 20 | MT-PE1 | 2 | PGMEA |
| Example 10 | W-10 | CR-97 | 35 | b-11 | 45 | IC-819 | 3 | M-315 | 20 | MT-PE1 | 2 | PGMEA |

TABLE 2-continued

| | Name | (A) Compound | (A) Parts by Weight | (B) Compound | (B) Parts by Weight | (C) Compound | (C) Parts by Weight | (D) Compound | (D) Parts by Weight | (F) Compound | (F) Parts by Weight | (E) |
|---|---|---|---|---|---|---|---|---|---|---|---|---|
| Example 11 | W-11 | CR-97 | 35 | b-11 | 45 | IC-819 | 3 | M-315 | 20 | — | — | PGMEA |
| Example 12 | W-12 | CR-97 | 35 | b-12 | 45 | IC-819 | 3 | M-315 | 20 | MT-PE1 | 2 | PGMEA |
| Example 13 | W-13 | CR-97 | 35 | b-13 | 45 | IC-819 | 3 | M-315 | 20 | MT-PE1 | 2 | PGMEA |
| Example 14 | W-14 | CR-97 | 35 | b-14 | 45 | IC-819 | 3 | M-315 | 20 | MT-PE1 | 2 | PGMEA |
| Example 15 | W-15 | CR-97 | 35 | b-15 | 45 | IC-819 | 3 | M-315 | 20 | MT-PE1 | 2 | PGMEA |
| Example 16 | W-16 | CR-97 | 35 | b-16 | 45 | IC-819 | 3 | M-315 | 20 | MT-PE1 | 2 | PGMEA |
| Example 17 | W-17 | CR-97 | 35 | b-17 | 45 | IC-819 | 3 | M-315 | 20 | MT-PE1 | 2 | PGMEA |
| Example 18 | W-18 | CR-97 | 35 | b-18 | 45 | IC-819 | 3 | M-315 | 20 | MT-PE1 | 2 | PGMEA |
| Example 19 | W-19 | CR-97 | 35 | b-19 | 45 | IC-819 | 3 | M-315 | 20 | MT-PE1 | 2 | PGMEA |
| Example 20 | W-20 | CR-97 | 35 | b-20 | 45 | IC-819 | 3 | M-315 | 20 | MT-PE1 | 2 | PGMEA |
| Example 21 | W-21 | CR-97 | 35 | b-21 | 45 | IC-819 | 3 | M-315 | 20 | MT-PE1 | 2 | PGMEA |
| Example 22 | W-22 | CR-97 | 35 | b-23 | 45 | IC-819 | 3 | M-315 | 20 | MT-PE1 | 2 | PGMEA |
| Example 23 | W-23 | CR-97 | 35 | b-24 | 45 | IC-819 | 3 | M-315 | 20 | MT-PE1 | 2 | PGMEA |
| Example 24 | W-24 | CR-97 | 35 | b-25 | 45 | IC-819 | 3 | M-315 | 20 | MT-PE1 | 2 | PGMEA |
| Example 25 | W-25 | CR-97 | 35 | b-11 | 45 | IC-819 | 3 | DPHA | 20 | MT-PE1 | 2 | PGMEA |
| Example 26 | W-26 | JR-301 | 35 | b-11 | 45 | IC-819 | 3 | M-315 | 20 | MT-PE1 | 2 | PGMEA |
| Example 27 | W-27 | JR-405 | 35 | b-11 | 45 | IC-819 | 3 | M-315 | 20 | MT-PE1 | 2 | PGMEA |
| Example 28 | W-28 | JR-600A | 35 | b-11 | 45 | IC-819 | 3 | M-315 | 20 | MT-PE1 | 2 | PGMEA |
| Example 29 | W-29 | JR-603 | 35 | b-11 | 45 | IC-819 | 3 | M-315 | 20 | MT-PE1 | 2 | PGMEA |
| Example 30 | W-30 | R960 | 35 | b-11 | 45 | IC-819 | 3 | M-315 | 20 | MT-PE1 | 2 | PGMEA |
| Example 31 | W-31 | CR-97 | 35 | b-11 | 45 | IC-907 | 3 | M-315 | 20 | MT-PE1 | 2 | PGMEA |
| Example 32 | W-32 | CR-97 | 25 | b-10 | 55 | IC-819 | 3 | M-315 | 20 | MT-PE1 | 2 | PGMEA |
| Example 33 | W-33 | CR-97 | 25 | b-11 | 55 | IC-819 | 3 | M-315 | 20 | MT-PE1 | 2 | PGMEA |
| Example 34 | W-34 | CR-97 | 25 | b-22 | 55 | IC-819 | 3 | M-315 | 20 | MT-PE1 | 2 | PGMEA |
| Example 35 | W-35 | CR-97 | 40 | b-11 | 40 | IC-819 | 3 | M-315 | 20 | MT-PE1 | 2 | PGMEA |
| Comparative Example 1 | WH-1 | CR-97 | 25 | b-23 | 55 | IC-819 | 3 | M-315 | 20 | MT-PE1 | 2 | PGMEA |
| Comparative Example 1 | WH-2 | CR-97 | 25 | b-24 | 55 | IC-819 | 3 | M-315 | 20 | MT-PE1 | 2 | PGMEA |
| Comparative Example 3 | WH-3 | CR-97 | 35 | b-25 | 45 | IC-819 | 3 | M-315 | 20 | MT-PE1 | 2 | PGMEA |
| Comparative Example 4 | WH-4 | CR-97 | 35 | b-26 | 45 | IC-819 | 3 | M-315 | 20 | MT-PE1 | 2 | PGMEA |
| Comparative Example 5 | WH-5 | CR-97 | 35 | b-26 | 45 | IC-907 | 3 | M-315 | 20 | MT-PE1 | 2 | PGMEA |

* not including the component (G), the component (H), the component (I) and the component (J).

TABLE 3

| | Name | (A) Compound | (A) Parts by Weight | (B) Compound | (B) Parts by Weight | (C) Compound | (C) Parts by Weight | (D) Compound | (D) Parts by Weight | (F) Compound | (F) Parts by Weight |
|---|---|---|---|---|---|---|---|---|---|---|---|---|
| Example 36 | W-36 | CR-97 | 35 | b-11 | 45 | IC-819 | 3 | M-315 | 20 | MT-PE1 | 2 |
| Example 37 | W-37 | CR-97 | 35 | b-11 | 45 | IC-819 | 3 | M-315 | 20 | MT-PE1 | 2 |
| Example 38 | W-38 | CR-97 | 35 | b-11 | 45 | IC-819 | 3 | M-315 | 20 | MT-PE1 | 2 |
| Example 39 | W-39 | CR-97 | 35 | b-11 | 45 | IC-819 | 3 | M-315 | 20 | MT-PE1 | 2 |
| Example 40 | W-40 | CR-97 | 35 | b-11 | 45 | IC-819 | 3 | M-315 | 20 | MT-PE1 | 2 |
| Example 41 | G-1 | CR-97 Bk-1 | 34.3 0.7 | b-11 | 45 | IC-819 | 3 | M-315 | 20 | MT-PE1 | 2 |

| | Name | (G) Compound | (G) Parts by Weight | (H) Compound | (H) Parts by Weight | (I) Compound | (I) Parts by Weight | (J) Compound | (J) Parts by Weight | (E) |
|---|---|---|---|---|---|---|---|---|---|---|
| Example 36 | W-36 | 2021P | 4 | — | — | — | — | — | — | PGMEA |
| Example 37 | W-37 | — | — | g-1 | 1 | — | — | — | — | PGMEA |
| Example 38 | W-38 | — | — | — | — | TINUVIN 405 | 0.5 | — | — | PGMEA |
| Example 39 | W-39 | — | — | — | — | — | — | LA-57 | 0.25 | PGMEA |
| Example 40 | W-40 | 2021P | 4 | g-1 | 1 | TINUVIN 405 | 0.5 | LA-57 | 0.25 | PGMEA |
| Example 41 | G-1 | — | — | — | — | — | — | — | — | PGMEA |

TABLE 4

Evaluation Results

| | Film Properties | | | | | | | | Chemical Resistance | |
|---|---|---|---|---|---|---|---|---|---|---|
| | Patternability | | Crack | Color Characteristics | | | | Adhe- | without Trans- parent Protecting | with Trans- parent Protecting |
| | Resolution | Shape | Resistance | L* | a* | b* | Change in Color | siveness | Film | Film |
| Example 1 | 150 μm | A | ≥20 μm | 87.26 | −1.29 | 1.09 | A | 4B | 1B | 4B |
| Example 2 | 150 μm | A | ≥20 μm | 87.52 | −1.51 | 1.15 | A | 4B | 3B | 4B |
| Example 3 | 150 μm | A | ≥10 μm | 86.39 | −1.61 | 0.99 | A | 4B | 3B | 4B |
| Example 4 | 150 μm | A | ≥15 μm | 87.10 | −1.71 | 1.07 | A | 4B | 3B | 4B |
| Example 5 | 150 μm | A | ≥15 μm | 87.33 | −1.26 | 1.12 | A | 4B | 3B | 4B |
| Example 6 | 150 μm | A | ≥15 μm | 87.56 | −1.23 | 1.15 | A | 4B | 3B | 4B |
| Example 7 | 150 μm | A | ≥20 μm | 87.15 | −1.32 | 1.06 | A | 4B | 3B | 4B |
| Example 8 | 150 μm | A | ≥20 μm | 86.96 | −1.35 | 1.03 | A | 4B | 1B | 4B |
| Example 9 | 150 μm | A | ≥20 μm | 87.62 | −1.48 | 1.18 | A | 4B | 1B | 4B |
| Example 10 | 150 μm | A | ≥20 μm | 87.88 | −1.45 | 1.21 | A | 4B | 3B | 4B |
| Example 11 | 150 μm | B | ≥20 μm | 87.42 | −1.54 | 1.12 | A | 4B | 1B | 4B |
| Example 12 | 150 μm | A | ≥20 μm | 87.27 | −1.57 | 1.09 | A | 4B | 1B | 4B |
| Example 13 | 150 μm | A | ≥20 μm | 86.49 | −1.58 | 1.02 | A | 4B | 3B | 4B |
| Example 14 | 150 μm | A | ≥15 μm | 86.69 | −1.55 | 1.05 | A | 4B | 3B | 4B |
| Example 15 | 150 μm | A | ≥15 μm | 86.29 | −1.64 | 0.96 | A | 4B | 3B | 4B |
| Example 16 | 150 μm | A | ≥20 μm | 86.09 | −1.67 | 0.93 | A | 4B | 1B | 4B |
| Example 17 | 150 μm | A | ≥15 μm | 87.20 | −1.68 | 1.10 | A | 4B | 3B | 4B |
| Example 18 | 150 μm | A | ≥10 μm | 87.49 | −1.65 | 1.13 | B | 4B | 3B | 4B |
| Example 19 | 150 μm | A | ≥20 μm | 87.00 | −1.74 | 1.04 | A | 4B | 3B | 4B |
| Example 20 | 150 μm | A | ≥15 μm | 86.80 | −1.77 | 1.01 | B | 4B | 1B | 4B |
| Example 21 | 150 μm | A | ≥20 μm | 87.26 | −1.29 | 1.09 | B | 4B | 3B | 4B |
| Example 22 | 150 μm | A | ≥20 μm | 87.23 | −1.23 | 1.13 | A | 4B | 1B | 4B |
| Example 23 | 150 μm | A | ≥20 μm | 87.49 | −1.22 | 1.18 | A | 4B | 0B | 3B |
| Example 24 | 150 μm | A | ≥20 μm | 87.14 | −1.20 | 1.20 | A | 4B | 1B | 4B |
| Example 25 | 150 μm | A | ≥10 μm | 87.46 | −1.26 | 1.12 | B | 4B | 1B | 4B |
| Example 26 | 150 μm | A | ≥20 μm | 87.06 | −1.35 | 1.32 | A | 4B | 3B | 4B |
| Example 27 | 150 μm | A | ≥20 μm | 86.86 | −1.38 | 0.97 | A | 4B | 3B | 4B |
| Example 28 | 150 μm | A | ≥20 μm | 87.03 | −1.32 | 0.86 | A | 4B | 3B | 4B |
| Example 29 | 150 μm | A | ≥20 μm | 87.26 | −1.29 | 1.17 | A | 4B | 3B | 4B |
| Example 30 | 150 μm | A | ≥20 μm | 87.30 | −1.35 | 0.90 | A | 4B | 3B | 4B |
| Example 31 | 150 μm | A | ≥20 μm | 87.45 | −1.2 | 1.7 | A | 4B | 3B | 4B |
| Example 32 | 150 μm | A | ≥10 μm | 87.29 | −1.34 | 1.87 | B | 4B | 3B | 4B |
| Example 33 | 150 μm | A | ≥20 μm | 87.47 | −1.54 | 1.95 | B | 4B | 3B | 4B |
| Example 34 | 150 μm | A | ≥10 μm | 87.52 | −1.51 | 1.15 | B | 4B | 3B | 4B |
| Example 35 | 150 μm | A | ≥20 μm | 87.32 | −1.54 | 1.12 | A | 4B | 3B | 4B |
| Example 36 | 150 μm | A | ≥20 μm | 86.64 | −1.41 | 0.97 | A | 4B | 4B | 4B |
| Example 37 | 150 μm | A | ≥20 μm | 87.73 | −1.45 | 1.19 | A | 5B | 4B | 5B |
| Example 38 | 80 μm | A | ≥20 μm | 87.95 | −1.42 | 1.15 | A | 4B | 3B | 4B |
| Example 39 | 150 μm | A | ≥20 μm | 87.03 | −1.68 | 1.01 | S | 4B | 3B | 4B |
| Example 40 | 80 μm | A | ≥20 μm | 87.49 | −1.47 | 0.96 | S | 5B | 5B | 5B |
| Example 41 | 150 μm | A | ≥20 μm | — | — | — | — | 4B | 4B | 4B |
| Comparative Example 1 | 150 μm | A | <5 μm | 88.13 | −1.39 | 1.27 | — | — | — | — |
| Comparative Example 2 | 150 μm | A | <5 μm | 87.72 | −1.48 | 1.18 | — | — | — | — |
| Comparative Example 3 | >150 μm | — | ≥20 μm | 87.57 | −1.51 | 1.15 | A | 4B | 0B | 0B |
| Comparative Example 4 | 150 μm | C | ≥15 μm | 87.06 | −1.51 | 1.09 | A | 4B | 0B | 0B |
| Comparative Example 5 | 150 μm | C | ≥15 μm | 86.86 | −1.77 | 1.12 | A | 4B | 0B | 0B |

From the evaluation results in Tables, it is evident that according to the negative-type photosensitive coloring composition of the present invention, it becomes possible to form a white light-shielding pattern which is not only excellent in chemical resistance but also extremely excellent in heat resistance and does not cause yellowing and cracks even after undergoing high-temperature treatment.

DESCRIPTION OF REFERENCE SIGNS a: Top view after formation of a white light-shielding cured film
b: Top view after formation of a transparent electrode
c: Top view after formation of an insulating film
d: Top view after formation of a metal wire
1: Glass substrate
2: White light-shielding cured film
3: Transparent electrode
4: Transparent insulating film
5: Wire electrode

INDUSTRIAL APPLICABILITY

The cured film formed by curing the negative-type photosensitive coloring composition according to the present invention is suitably used for a light-shielding pattern of a touch panel or the like.

The invention claimed is:

1. A negative-type photosensitive coloring composition, comprising:
(A) a white pigment;
(B) a polysiloxane obtained by co-hydrolyzate condensation of an alkoxysilane compound containing a compound represented by the following general formula (1), a compound represented by the following general formula (2) and a compound represented by the following general formula (3);
(C) a polyfunctional acrylic monomer;
(D) a photoradical polymerization initiator;
(E) an organic solvent; and
(F) a polyfunctional thiol compound;
wherein in the alkoxysilane compound, the amount of the compound represented by the general formula (1) is 25 to 75% by mole, the amount of the compound represented by the general formula (2) is 10 to 45% by mole, and the amount of the compound represented by the general formula (3) is 1 to 20% by mole;
wherein formulas (1), (2) and (3) are represented as follows:

$$R^1_2Si(OR^2)_2 \quad (1)$$

wherein $R^1$s each independently represent a methyl group or a phenyl group, and $R^2$s each independently represent hydrogen or an alkyl group having 1 to 4 carbon atoms;

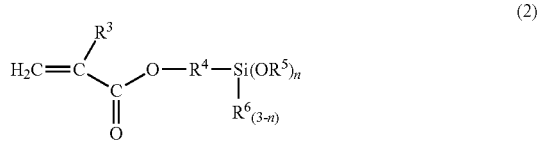

(2)

wherein $R^3$ represents a methyl group or hydrogen, $R^4$ represents an alkylene group having 1 to 4 carbon atoms, $R^5$s each independently represent hydrogen or an alkyl group having 1 to 4 carbon atoms, $R^6$s each independently represent an alkyl group having 1 to 6 carbon atoms, and n represents an integer of 1 to 3; and

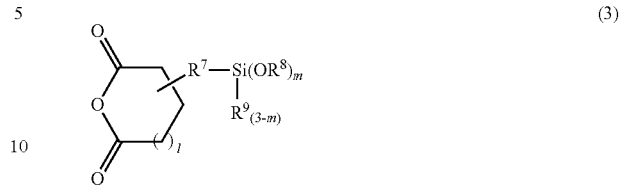

(3)

wherein l represents an integer of 0 to 2, m represents an integer of 1 to 3, $R^7$ represents an alkylene group having 1 to 4 carbon atoms, $R^8$s each independently represent hydrogen or an alkyl group having 1 to 4 carbon atoms, and $R^9$s each independently represent an alkyl group having 1 to 6 carbon atoms; and
wherein (C) the polyfunctional acrylic monomer is a compound represented by the following general formula (4):

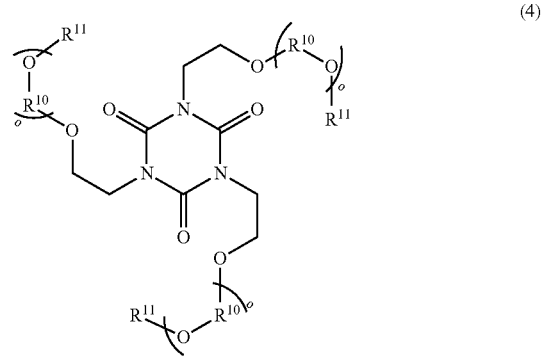

(4)

wherein $R^{10}$ represents an alkylene group having 1 to 4 carbon atoms, o each independently represent an integer of 0 to 5, and $R^{11}$s each independently represent an acryloyl group, a methacryloyl group or hydrogen, and not all $R^{11}$ are hydrogen.

2. The negative-type photosensitive coloring composition according to claim 1, wherein (A) the white pigment is titanium dioxide.

3. The negative-type photosensitive coloring composition according to claim 1, wherein the compound represented by the general formula (1) is dialkoxydiphenylsilane or dihydroxydiphenylsilane.

4. The negative-type photosensitive coloring composition according to claim 1, wherein (D) the photoradical polymerization initiator is an acylphosphine oxide-based photopolymerization initiator.

5. The negative-type photosensitive coloring composition according to claim 1, wherein the alkoxysilane compound contains a compound represented by the following general formula (5):

$$R^{12}Si(OR^{13})_3 \quad (5)$$

$R^{12}$ represents a monovalent organic group having an epoxy group, and $R^{13}$s each independently represent an alkyl group having 1 to 4 carbon atoms.

6. The negative-type photosensitive coloring composition according to claim 1, comprising (G) an alicyclic epoxy compound.

7. The negative-type photosensitive coloring composition according to claim 1, comprising (H) a silane coupling agent represented by the following general formula (6):

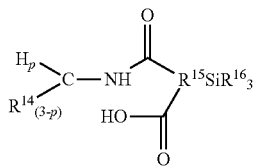

(6)

wherein $R^{14}$s each independently represent an alkyl group having 1 to 6 carbon atoms or a substituted group thereof, p represents 0 or 1, $R^{15}$ represents a trivalent organic group having 3 to 30 carbon atoms, and $R^{16}$s each independently represent an alkyl group having 1 to 6 carbon atoms, an alkoxy group having 1 to 6 carbon atoms, a phenyl group or a phenoxy group, or substituted groups thereof.

8. The negative-type photosensitive coloring composition according to claim 1, comprising (I) an ultraviolet absorber.

9. The negative-type photosensitive coloring composition according to claim 1, comprising (J) a radical scavenger.

10. A cured film obtained by curing the negative-type photosensitive coloring composition according to claim 1.

11. A light-shielding pattern for a touch panel including the cured film according to claim 10.

12. A method for manufacturing a touch panel, comprising at least (i) a step of applying, onto a substrate, the negative-type photosensitive coloring composition according to claim 1, (ii) a step of drying the substrate having the composition applied by reducing the pressure and/or heating, (iii) a step of exposing the dried substrate to light through a mask, (iv) a step of developing the substrate exposed to light with use of a developing solution to form a pattern, and (v) a step of curing the developed substrate by heating.

* * * * *